United States Patent [19]
Sato et al.

[11] Patent Number: 5,761,124
[45] Date of Patent: Jun. 2, 1998

[54] SEMICONDUCTOR NONVOLATILE MEMORY DEVICE IN WHICH HIGH CAPACITANCE BIT LINES ARE ISOLATED FROM SENSE AMPLIFIER INPUT/OUTPUT NODES DURING AMPLIFYING OPERATION OF SENSE AMPLIFIER

[75] Inventors: Hiroshi Sato; Takashi Yamazaki, both of Ohme, Japan

[73] Assignee: Hitachi, Ltd., Tokyo, Japan

[21] Appl. No.: 650,842

[22] Filed: May 20, 1996

Related U.S. Application Data

[63] Continuation of Ser. No. 285,536, Aug. 5, 1994, abandoned.

[30] Foreign Application Priority Data

Aug. 9, 1993 [JP] Japan ................ 5-217084
Nov. 4, 1993 [JP] Japan ................ 5-299006

[51] Int. Cl.$^6$ ................................ G11C 16/06
[52] U.S. Cl. ............... 365/185.22; 365/185.18; 365/185.2; 365/185.21; 365/185.25
[58] Field of Search .............. 365/205, 190, 365/203, 208, 210, 227, 185.06, 185.16, 185.18, 185.2, 185.21, 185.25, 185.22

[56] References Cited

U.S. PATENT DOCUMENTS

| | | | |
|---|---|---|---|
| 4,694,427 | 9/1987 | Miyamoto et al. | 365/185.23 |
| 4,804,871 | 2/1989 | Walters, Jr. | 327/54 |
| 4,933,906 | 6/1990 | Terada et al. | 365/208 |
| 5,022,009 | 6/1991 | Terada et al. | 365/210 |
| 5,343,433 | 8/1994 | Duvvury et al. | 365/205 |
| 5,377,151 | 12/1994 | Komuro | 365/208 |
| 5,446,690 | 8/1995 | Tanaka et al. | 365/185.25 |

OTHER PUBLICATIONS

IEEE 1992 Symposium on VLSI Circuits Digest of Technical Papers, "A Quick Intelligent Program Architecture for 3V-Only NAND-EEPROMs", T. Tanaka, et al., pp. 20–21.
"Fundamentals of MOS Digital Integrated Circuits", John P. Uyemura, pp. 414 and 547.

*Primary Examiner*—David C. Nelms
*Assistant Examiner*—Andrew Q. Tran
*Attorney, Agent, or Firm*—Antonelli, Terry, Stout, & Kraus, LLP

[57] ABSTRACT

A CMOS latch circuit is used as a sense amplifier, and a switch circuit is connected between the input/output of the sense amplifier and a data line or bit line and is turned OFF immediately before or after the amplifying operation of the sense amplifier. During the amplifying operation of the sense amplifier, the data line or bit line having a large parasitic capacitance, as a result of being connected, typically, to a large number of memory transistors, is electrically disconnected or electrically isolated from the sense amplifier. As a result, the sense amplifier may have its input/output parasitic capacitor driven so that its operation speed can be increased while reducing its power consumption.

37 Claims, 21 Drawing Sheets

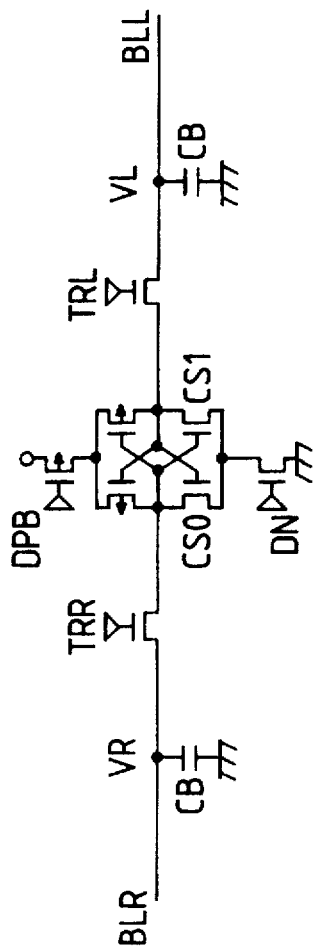
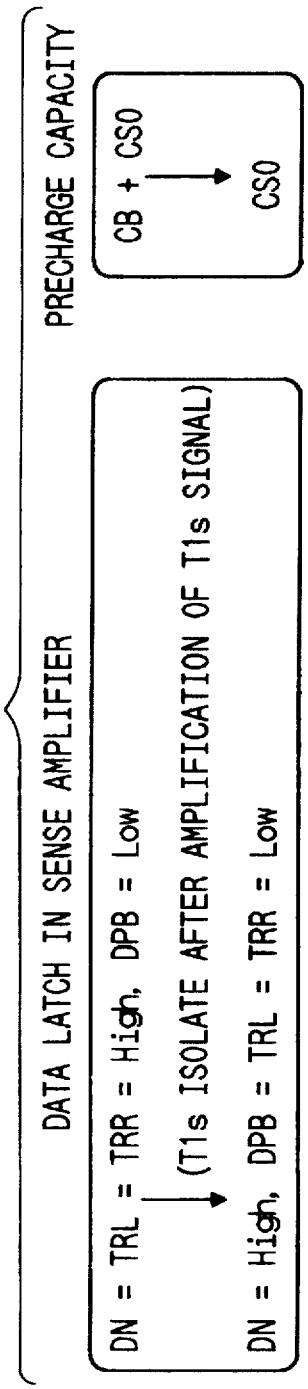

SEMICONDUCTOR NONVOLATILE MEMORY DEVICE IN WHICH HIGH CAPACITANCE BIT LINES ARE ISOLATED FROM SENSE AMPLIFIER INPUT/OUTPUT NODES DURING AMPLIFYING OPERATION OF SENSE AMPLIFIER

This is a continuation of application Ser. No. 08/285,536, filed Aug. 5, 1994, now abandoned.

BACKGROUND OF THE INVENTION

The present invention relates to a semiconductor memory device and, more particularly, to a technique which is effective when applied to a technology for increasing the speed and lowering the power consumption of a flash erasable type EEPROM (i.e., Electrically Erasable/Programmable Read Only Memory).

The electric flash erasable type EEPROM is a non-volatile memory device having a function to electrically erase either all memory cells formed on a chip or electrically erase a group including some of the memory cells formed on the chip, in a batch.

This flash erasable type EEPROM is disclosed on pp. 152 to 153 of IEEE INTERNATIONAL SOLID-STATE CIRCUITS CONFERENCE OF 1980, on pp. 76 to 77 of IEEE INTERNATIONAL SOLID-STATE CIRCUITS CONFERENCE OF 1987 and on pp. 1,157 to 1,163 of IEEE, J. Solid-State Circuits, vol. 23 (1988).

FIG. 21 is a schematic diagram showing a sectional structure of a memory cell of an electric flash erasable type EEPROM which was disclosed in the International Electron Device Meeting of 1987. The memory cell, as shown, has a structure similar to that of an ordinary EPROM memory cell. Specifically, the memory cell is constructed of an insulated gate type field effect transistor (which will be called the "MOSFET" or merely the "transistor") having a two-layered gate structure. In FIG. 21: reference numeral 8 designates a P-type silicon substrate; numeral 11 a P-type diffusion layer formed over the silicon substrate 8; numeral 10 a lightly doped N-type diffusion layer formed over the silicon substrate 8; and numerals 9 designate N-type diffusion layers individually formed over the P-type diffusion layer 11 and the N-type diffusion layer 10, respectively. Moreover: numeral 4 designates a floating gate formed over the P-type silicon substrate 8 through a thin oxide film 7; numeral 6 a control gate formed over the floating gate 4 through the oxide film 7; numeral 3 designates a drain electrode; and numeral 54 a source electrode. In short, the memory cell, as shown, is constructed of an N-channel type MOSFET having a two-layered structure for storing information. Here, the information is stored substantially as the change in the threshold voltage in the transistor.

In the following, the memory cell will be described in a case which the transistor for storing the information (as will be called the "memory transistor") is of the N-channel type, unless otherwise specified. The operation of programming the information in the memory cell, as shown in FIG. 21, is similar to that of the EPROM. Specifically, the programming operation is carried out by injecting the hot carriers generated in the vicinity of the drain region 9, connected with the drain electrode 3, into the floating gate 4. As a result of this programming operation, the memory transistor has its threshold voltage, as viewed from its control gate 6, raised to a higher level than that of a memory transistor which is left unprogrammed.

In the erasing operation, on the other hand, a high field is established between the floating gate 4 and the source region 9 connected with the source electrode 5, by grounding the control gate 6 to the earth and by applying a high voltage to the source electrode 5, so that the electrons stored in the floating gate 4 are extracted via the source region 9 to the source electrode 5 by making use of the tunnel phenomenon through the thin oxide film 7. As a result, the stored information is erased. In short, as a result of this erasing operation, the memory transistor has its threshold voltage lowered, as viewed from its control gate 6.

In the reading operation, the voltage to be applied to the drain electrode 3 and the control gate 6 is limited to a relatively low level so as to prevent a weak programming of the aforementioned memory cell, that is, to prevent the undesirable carrier from being injected into the floating gate 4. For example, a voltage as low as about 1 V is applied to the drain electrode 3, and a voltage as low as about 5 V is applied to the control gate 6. By detecting the magnitude of the channel current which is caused to flow through the memory transistor by applying those voltages, the information "0" or "1" stored in the memory cell is judged.

SUMMARY OF THE INVENTION

The operation of reading the memory transistor described above has a memory cycle as slow as about 1 μs. We have intended to increase the speed and lower the power consumption by noting that the information is not broken in the memory transistor thus far described by the reading operation unlike the dynamic memory cell.

An object of the present invention is to provide a semiconductor memory device capable of increasing the reading operation speed and lowering the power consumption.

The foregoing and other objects and novel features of the present invention will become apparent from the following description to be made with reference to the accompanying drawings.

A representation of the invention to be disclosed herein will now be briefly summarized in the following. Specifically, a CMOS latch circuit is used as a sense amplifier, and a switch circuit is connected between the input/output of the CMOS latch circuit and a data line or a bit line so that the switch circuit is turned OFF immediately before or after the start of amplification of the sense amplifier.

According to the means described above, during the amplifying operation of the sense amplifier, the data line or bit line having a large parasitic capacitance by being connected to a number of memory transistors is disconnected (electrically isolated) from the sense amplifier, and the sense amplifier may drive only the parasitic capacitor coupled to its input/output so that the speed can be increased while lowering the power consumption.

BRIEF DESCRIPTION OF THE DRAWINGS

FIGS. 1(A) and 1(B) are diagrams of fundamental constructions for explaining the schematic operations of a sense amplifier to be used in a semiconductor memory device according to the present invention;

DESCRIPTION OF THE PREFERRED EMBODIMENTS

Figure 2:
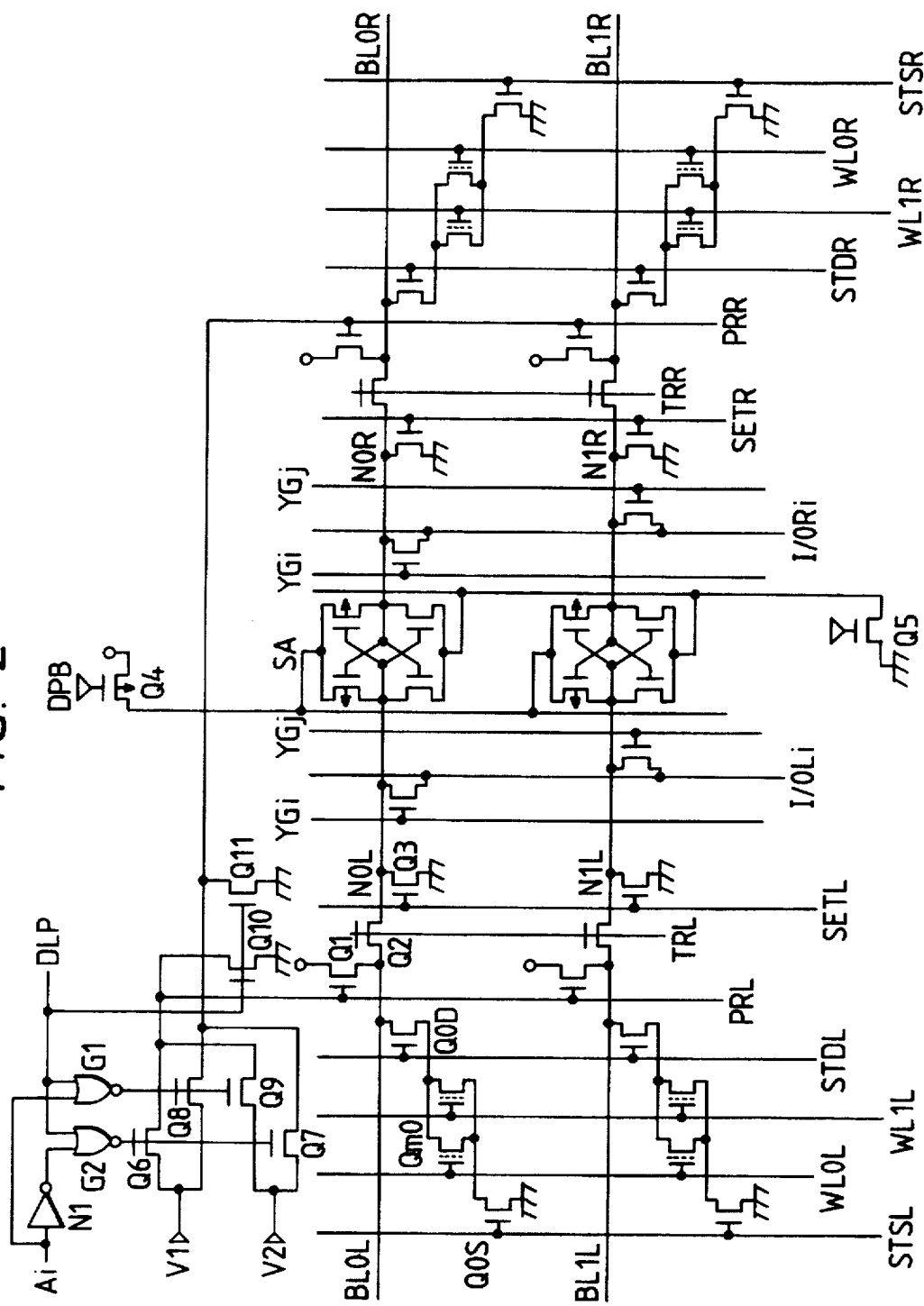
FIG. 2 is a circuit diagram showing one embodiment of a sense amplifier and a memory array of a flash erasable type EEPROM according to the present invention.

FIGS. 1(A) and 1(B) are basic construction diagrams for schematically explaining the operation of a sense amplifier to be used in the semiconductor memory device according to the present invention. As shown in FIG. 1(A), the sense amplifier is constructed of: a CMOS latch circuit constituted by a pair of cross-coupled CMOS inverter circuits, i.e., in which the input and output of one CMOS inverter circuit is connected to the output and input of the other CMOS inverter circuit and vice-versa, respectively, and in which each CMOS inverter circuit is composed of a P-channel type MOSFET and an N-channel type MOSFET; a P-channel type power switch MOSFET for feeding a supply voltage to the P-channel type MOSFET in response to a sense amplifier activating signal DPB; and an N-channel type power switch MOSFET for feeding the earth potential of the circuit to the N-channel type MOSFET in response to a sense amplifier activating signal DN.

At the input/output nodes of the sense amplifier, there are located relatively low parasitic capacitors CS0 and CS1 which are made of the gate capacitances of the MOSFET. Bit lines (or data lines) BLR and BLL are characterized as having a relatively high parasitic capacitor CB as a result of being connected with a number of not-shown memory cells and are connected with the paired input/output nodes of the sense amplifier through a switch MOSFET which is made receptive of control signals TRR and TRL.

In this embodiment, the signal is read out from the selected one of the paired bit lines BLR and BLL connected with the paired input/output nodes of the sense amplifier, whereas the potential of the unselected bit line is read out as a reference potential. When the stored information of the memory cell connected with one bit line BLR is to be read out, for example, its precharge voltage VR is used as a reading precharge voltage, whereas a precharge voltage VL of the unselected bit line BLL is used as the reference voltage for the information read out from the memory cell.

The aforementioned reading precharge voltage is set to a relatively low voltage at about 1 V so as to elongate the soft write lifetime of the memory cell to be described hereinafter. Accordingly, the precharge voltage for the reference voltage is set to an intermediate potential having a reading amplitude of about 0.5 V.

As shown in FIG. 1(B), the sense amplifier has its input/output nodes fed with the read signal from the selected bit line and the reference voltage from the unselected bit line so that the switch MOSFET Ts is turned OFF immediately before or after the sense amplifier starts its amplifying operation. In the sense amplifier, therefore, when the read signal of the selected bit line BLR is at the high level, the precharge capacitor to be precharged for amplifying the read signal to a full amplitude corresponding to the supply voltage is the input/output parasitic capacitor CSO because the bit line capacitor CB is isolated. As a result, the load on the sense amplifier can be lightened to lower the power consumption and increase the speed.

Figure 7:
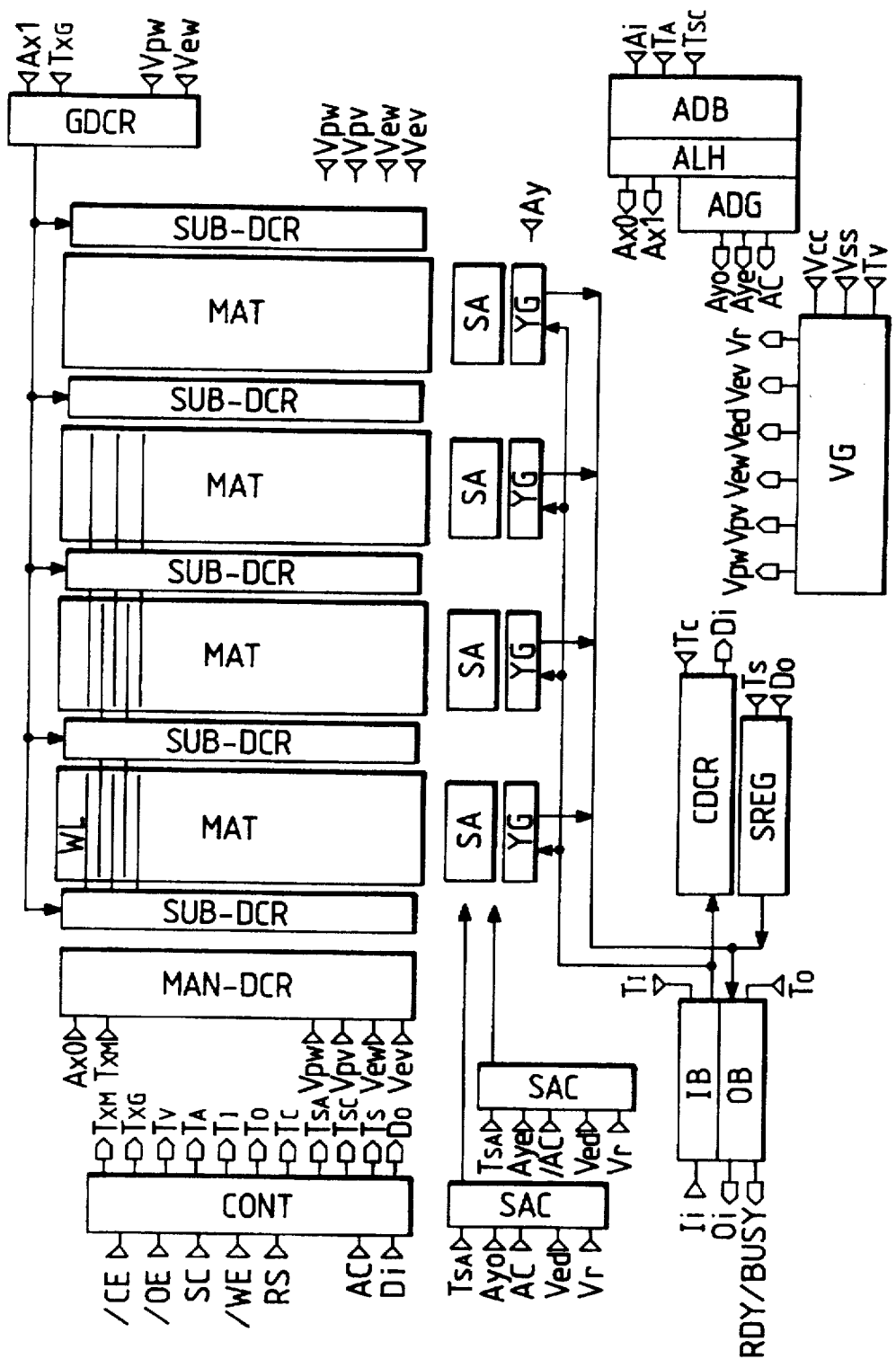
FIG. 7 is a block diagram showing one embodiment of a flash erasable type EEPROM according to the present invention.

FIG. 7 is a block diagram showing one embodiment of the flash erasable type EEPROM according to the present invention. The individual circuit blocks of FIG. 7 are formed over one semiconductor substrate of single crystalline silicon by the well-known semiconductor integrated circuit manufacturing technique, although not especially limitative thereto.

In this embodiment, the memory array is constructed of four memory mats MAT, although not especially limitative thereto. Each of these memory mats MAT is equipped with a sub-decoder SUB-DCR for producing a signal to select word lines WL. Since these word lines are formed to have a narrow pitch for the high integration, the sub-decoder SUB-DCR interposed between the memory mats MAT produces a word line selecting signal for the memory mats MAT at its two sides. As illustrated, for example, the word lines of the memory mat MAT are alternately connected with the two sub-decoders SUB-DCR across the memory mat MAT.

A main decoder MAN-DCR is constructed, as will be described hereinafter, of a circuit for producing the select signal of the selected MOSFET for selecting the plurality of memory cells and the select and unselect levels of the sub-decoder SUB-DCR. A gate decoder GDCR produces a select signal for selecting one memory cell of one memory block selected by the main decoder MAN-DCR.

Figure 21:
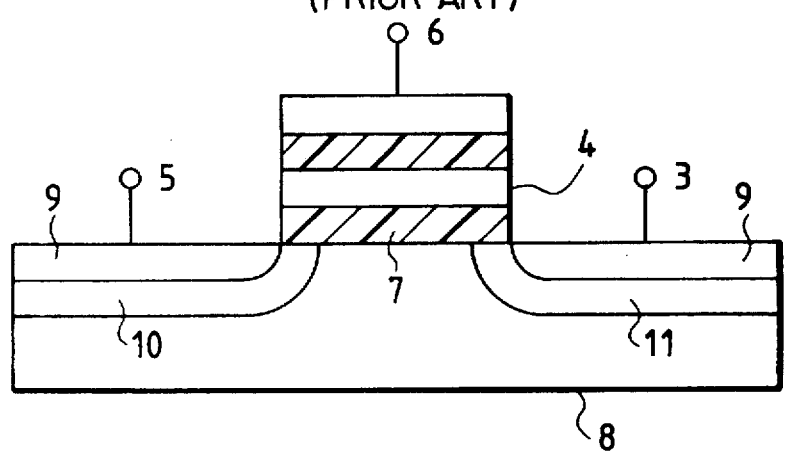
FIG. 21 is a schematic section showing one example of the memory cell.

The memory transistors formed in the memory mat MAT have a construction similar to that of the memory cells shown in FIG. 21, although not especially limitative thereto. However, both the erasing and programming operations are achieved by injecting and releasing the electric charge into and out of the floating gates by a tunnel current. Alternatively, the programming operation may be achieved with the hot carriers, as shown in FIG. 21.

A sense amplifier SA is constructed of a later-described CMOS latch circuit and has its amplifying operation controlled by a sense amplifier control circuit SAC, although not especially limitative thereto. In the first reading cycle, both two groups of sense amplifiers are activated, although not especially limitative thereto. In the case of continuous reading operation accompanied by the subsequent switching of the word lines, these word lines are switched whereas the sense amplifiers belonging to one of the aforementioned two groups are caused to start their amplifying operations, while the read signals are being sequentially outputted from the sense amplifiers of the other group after the read signals of the sense amplifiers of the one group has ended.

In order to increase the speed of the operation and lower the power consumption, the aforementioned sense amplifier SA responds to the read signal necessary for the amplifying operations from the data lines, to amplify and latch the fetched signal while being isolated from the data lines, immediately before or soon after the amplifying operations of the sense amplifier have begun. Thus, the signals selected by a Y-gate circuit YG can be sequentially outputted through a data output buffer OB, and the word lines corresponding to a next address can be switched, as described above, in parallel with the signal outputting operations.

A status register SREG can receive the status data indicating the internal status in response to a signal. TS and can monitor the operating status from the outside through the data output buffer OB, if necessary. In this embodiment, the continuous accessing operation and the electric programming and erasing operations are carried out, as described above. Thus, the status register SREG is provided, as described above, because the internal status has to be known from the outside in the course of each of the operations.

A voltage generator VG acts as a DC-DC converter which receives a supply voltage VCC at 3.3 V (or 5 V) and an earth potential VSS of the circuit, to provide various voltages Vpw, Vpv, Vew, Ved, Vev and Vr necessary for the reading and erasing operations in response to a control signal TV.

An address buffer ADB fetches an address signal Ai from an external terminal to latch it in an address latch ALH. A signal TA is a control signal for latching the aforementioned address signal, and letters TSC designate an internal serial clock.

An address generator ADG has a counter circuit, for example, and performs an address stepping operation in response to the internal serial clock TSC, which is produced in synchronism with a clock SC fed from the outside, to produce an address signal Ayo for activating the sense amplifier SA corresponding to an odd data line, an address signal Aye for activating the sense amplifier SA corresponding to an even data line, and a signal AC for switching the word lines. In short, in the semiconductor memory device of this embodiment, the address signals for the subsequent consecutive accessing operations are internally produced merely by inputting a designated address in response to the clock SC fed from the external terminal. The aforementioned signals Ayo, Aye and AC and a signal /AC are fed to the sense amplifier control circuit SAC. Here, the symbol "/" attached to the signal AC indicates that the signal "/AC" is a bar signal indicating that its low level is an active level. This indication will likewise apply to the following other signals.

In response to a Y-address signal Ay, the Y-gate YG produces one data line select signal, when in the reading operation, to select a signal for amplifying the corresponding sense amplifier and transmit it to the data output buffer OB. When in the programming operation, the Y-gate YG produces one data line selecting signal to transmit a signal corresponding to the program data inputted from a data input buffer IB, to a data line or a bit line. In the present application, the data lines and the bit lines are used in the same meaning and may be called the "digit lines".

A command decoder CDCR decodes a command inputted from the data input buffer IB and transmits command data Di to a control circuit CONT, as will be described in the following. A signal TC is a command decoder control signal for controlling the fetch of a command and the decoder.

In response to a chip enable signal /CE, an output enable signal /OE, a write enable signal /WE, a clock signal SC and a reset signal RS to be fed from the external terminals, the control circuit CONT produces various timing signals necessary for the operations of an internal circuit. A signal TXM is a main decoder control signal for switching the positive/negative logics in programming and program verifying operations. A signal TXG is a gate decoder control signal. A signal TV is a supply circuit control signal. A signal TA is an address buffer control signal for controlling the latch or the like of addresses. A signal TI is a data input buffer control signal for controlling the fetch or the like of data or commands.

A signal TO is a data output buffer control signal for controlling the outputting or the like of data. A signal TC is a command decoder control signal for controlling the fetch, decoding or the like of commands. A signal TS is a status register control signal for controlling the setting, resetting or the like of the status register SREG. A signal TSA is a sense amplifier control signal to be used for controlling the activation timing. A signal TSC is an internal serial clock. A signal AC is a signal for switching the word lines.

In addition, a signal Ax0 to be fed from the address latch ALH to the main decoder MAN-DCR is an X-address signal for instructing the memory block to be selected, and a signal Ax1 to be fed from the address latch ALH to the gate decoder GDCR is an X-address signal for instructing one word line in one memory block. The signal Ay to be fed to the Y-gate YG is a Y-address signal.

The letters Vpw designate a word line voltage at the programming time. The letters Vpv designate a word line voltage at the program verifying time. The letters Vev designate a word line voltage at the erase verifying time. The letters Vew designate a word line voltage at the erasing time. The letters Ved designate a data line voltage at the erasing time. The letters Vr designate a data line precharge voltage.

A signal Oi is the output data which is outputted from the data output buffer OB; a signal Do is a status data; and a signal Di is a command data. Moreover, a signal RDY/BUSY is an output signal indicating the status of the chip.

Figure 8:
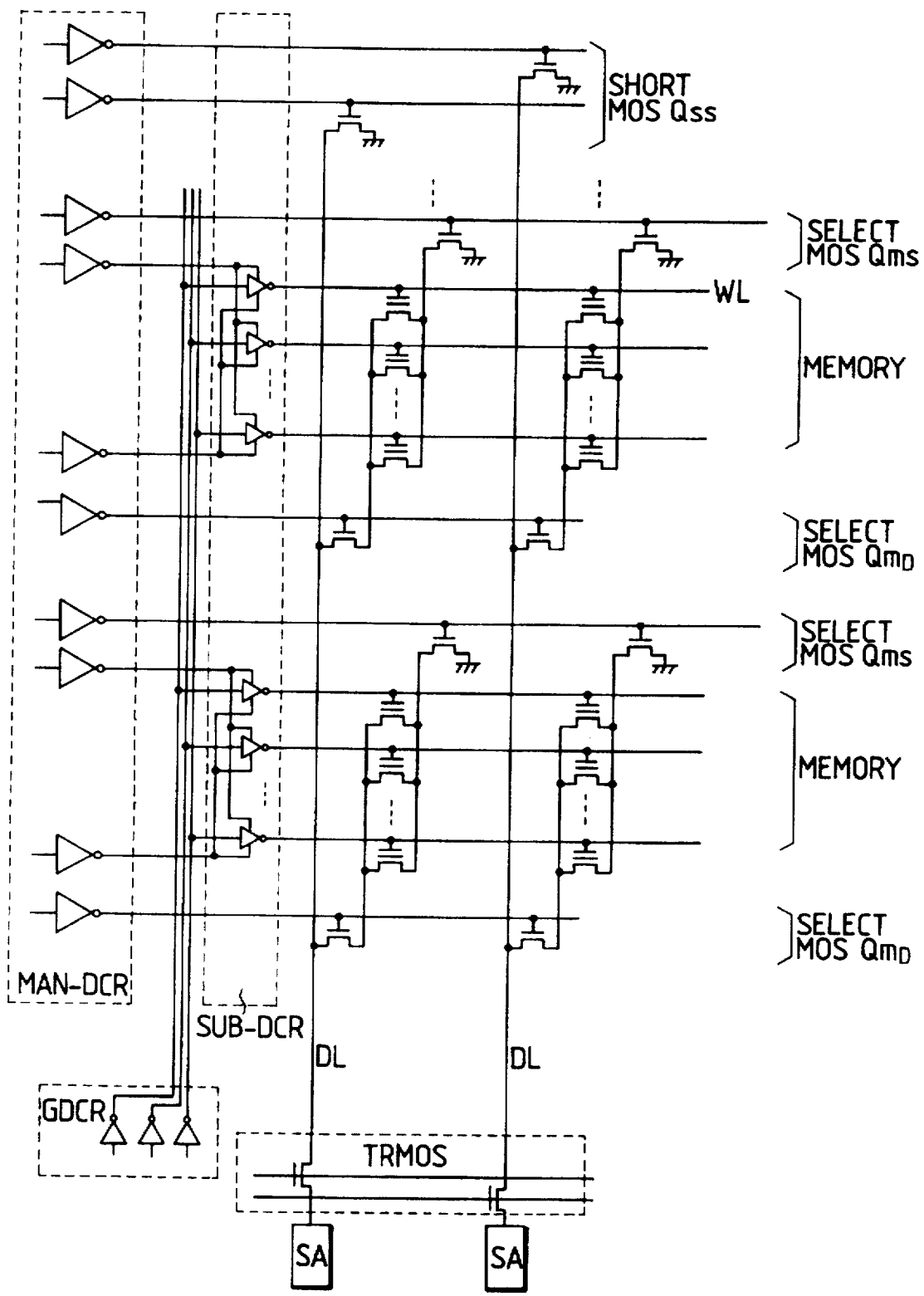
FIG. 8 is a schematic circuit diagram showing one embodiment of the memory mat and its peripheral portion.

FIG. 8 is a schematic circuit diagram showing one embodiment of the aforementioned memory mat and its peripheral portion. The memory cells are constructed of MOSFETs which have the stacked gate structure equipped with a control gate and a floating gate similar to those of FIG. 21. In this embodiment, both the programming operation and the erasing operation are carried out by making use of the tunnel current through a thin oxide film, as will be described hereinafter.

A plurality of the aforementioned memory MOSFETs are grouped into one block to have their drains and sources made common. The common drains of the memory MOSFETs are connected to the data line DL through a select MOSEET QmD. The common sources of the memory MOSFETs are fed with the earth potential of the circuit through a select MOSFET Qms. The control gates of the memory MOSFETs are connected with the word line WL. The aforementioned MOSFETs QmD and Qms are selected by the select lines extending in parallel with the word line WL. In short, the wiring line to be coupled to the select MOSFET can be deemed as the main word line to be selected by the main decoder MAN-DCR.

Thanks to the aforementioned construction that the memory cells are grouped into the blocks to be fed with the data lines DL and the earth potential of the circuit through the select MOSFETS, it is possible to reduce the stress upon the unselected memory cells. In other words, the aforementioned programming or erasing voltage is prevented from being applied to the memory cells, which have their word lines selected and their data lines unselected, and the memory cells which have their word lines unselected and their data lines selected to latch the data in the programming or erasing operation (that is, the memory cells which have their stored content fixed by executing the programming or erasing operation). In other words, the memory cells, which have already programmed and latched the data, have their contents from being changed by executing the programming or erasing operation of the remaining memory cells. In this construction, the aforementioned stress is deemed to be applied to a small number of memory cells in the aforementioned block.

In this embodiment, the adjoining data lines DL are divided into odd and even ones, as will be described hereinafter, although not especially limitative thereto. Each of these data lines DL is equipped with a corresponding short MOSFET Qss. These short MOSFETs Qss select the odd and even data lines DL alternately to set the unselected data lines DL to the fixed level of the earth potential of the circuit thereby to reduce the mutual coupling noise between the adjoining data lines DL. In a manner to correspond to this construction of the data lines DL, transfer MOSFETs (TRMOS) are also selected as the switch circuit into the odd and even ones for the sense amplifier SA for amplifying the read signals appearing on the data lines DL.

One of the memory cells in the block selected by the aforementioned main decoder MAN-DCR is selected by the sub-decoder SUB-DCR. This sub-decoder SUB-DCR selects one word line WL in that block. This one word selecting signal is produced by the gate decoder GDCR. In other words, the sub-decoder SUB-DCR produces the drive signals for selecting/unselecting the word lines in the block in response to the word line selecting signal produced by the gate decoder GDCR and the select/unselect levels produced according to the operation mode produced by the main decoder MAN-DCR.

TABLE 1

|  |  | Read | Program | Erase |
|---|---|---|---|---|
| Select | Vg | Vcc | –10 V | 12 V |
|  | Vd | 1 V | 4 V | –4 V |
|  | Vs | 0 V | open | –4 V |
| Unselect | Vg | 0 V/open | Vcc/0 V | 0 V/0 V |
|  | Vd | 1 V/open | 0 V/open | –4 V/open |
|  | Vs | 0 V/open | open/open | –4 V/open |

In the individual read, program and erase operation modes, the memory MOSFET has its gate voltage (on the word lines WL) Vg, drain voltage Vd and source voltage Vs fed with the levels, as tabulated in Table 1. By combining the relative potentials of the gate voltage Vg, the drain voltage Vd and the source voltage Vs of Table 1, the tunnel current is generated through the thin gate insulating film to inject or release the electric charge into and out of the floating gates. As a result, the threshold voltage is changed to effect the program and erase operations. These operations have definitions reversed from those of FIG. 21 but not any substantial difference.

In the Unselect of Table 1, the two voltages or statuses, as divided by the symbol "/" (or slash), correspond to the selected block / the unselected block. Specifically, the unselected block is opened in most cases in response to the OFF status of the selected MOSFET. As a result, the memory MOSFETs of the unselected block can be freed from the stress.

Figure 9:
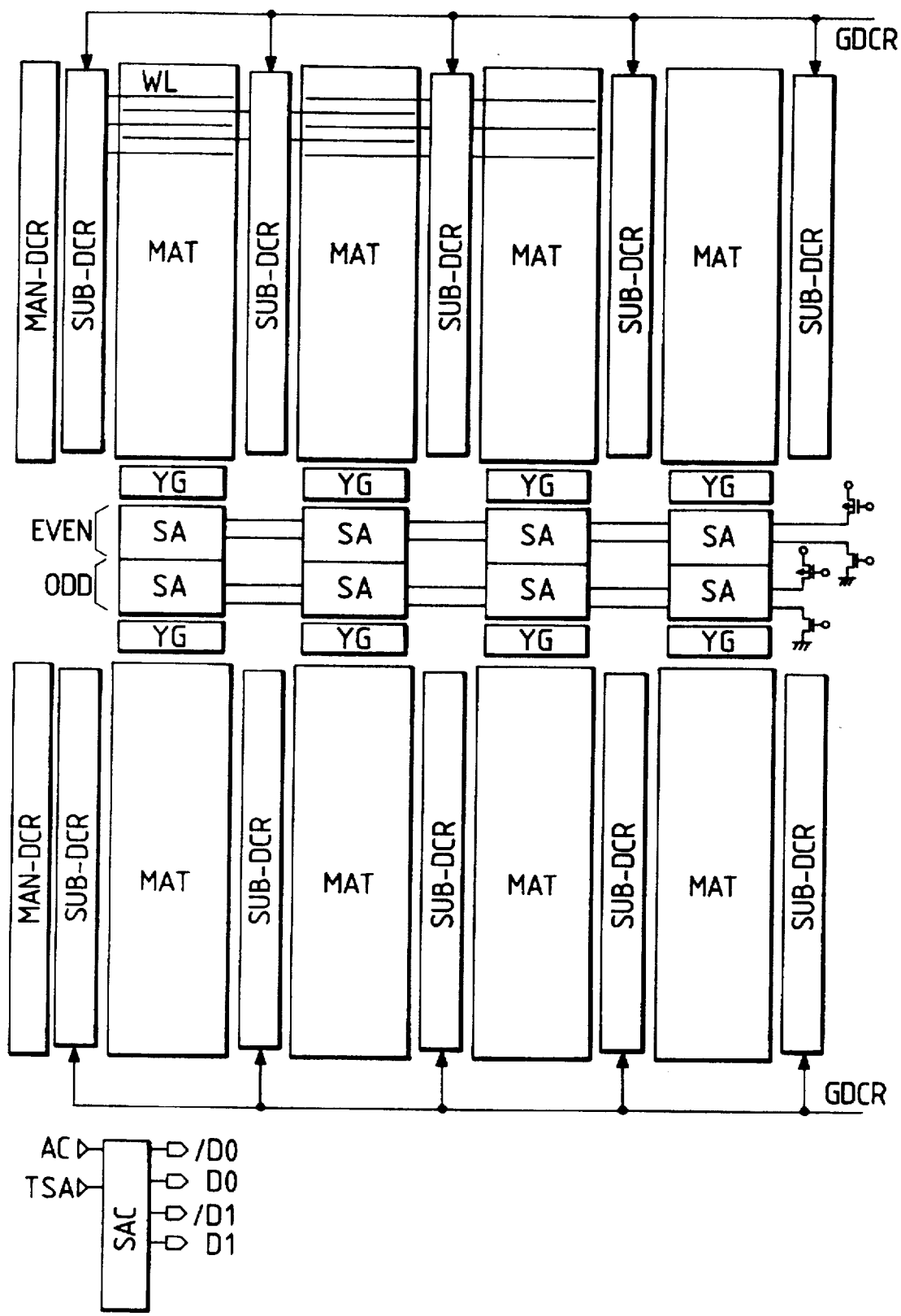
FIG. 9 is a block diagram showing another embodiment of a flash erasable type EEPROM according to the present invention.

FIG. 9 is a block diagram showing an essential portion of another embodiment of the semiconductor memory device according to the present invention. In this embodiment, a pair of memory mats are so vertically arranged as to correspond to the input/output of the paired sense amplifiers of the CMOS latch circuit. These sense amplifiers are divided into those for the EVEN data lines and the ODD data lines. Although the sense amplifiers SA for the even lines and the sense amplifiers SA for the odd lines are vertically shown in FIG. 9, they may be practically arranged on line.

The paired inputs of the even sense amplifier are connected with the even data lines of the upper and lower memory mats. The paired inputs of the odd sense amplifier are connected with the odd data lines of the upper and lower memory mats. The sub-decoder SUB-DCR, the main decoder MAN-DCR and the gate decoder GDCR (although not shown) to be provided for the memory mats are similar to the aforementioned ones of FIG. 7.

The sense amplifier control circuit SAC produces even sense amplifier activating signals /D0 and D0 and odd sense amplifier activating signals /D1 and D1. The signal /D0 is fed to the gates of the P-channel type MOSFETs for feeding the supply voltage to the even sense amplifiers SA, and the signal D0 is fed to the gates of the N-channel type MOSFETs for feeding the earth potential of the circuit to the even sense amplifiers SA. Likewise, the signal /D1 is fed to the gates of the P-channel type MOSFETs for feeding the supply voltage to the odd sense amplifiers SA, and the signal D1 is fed to the gates of the N-channel type MOSFETs for feeding the earth potential of the circuit to the odd sense amplifiers SA. The address buffers, the input/output buffers, the control circuits and the voltage generators are omitted from FIG. 9 because they are similar to those of the foregoing embodiment of FIG. 7.

Figure 10:
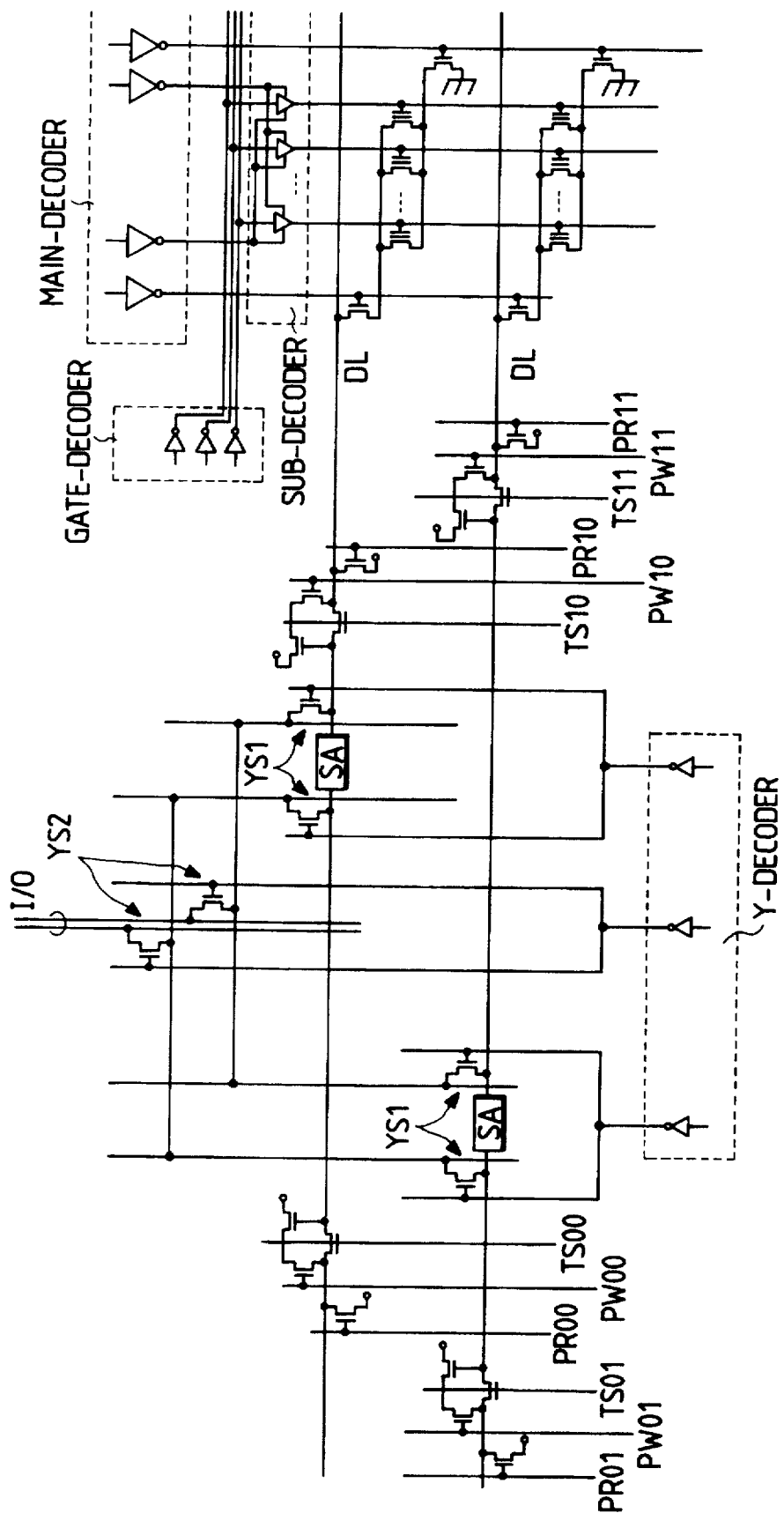
FIG. 10 is a schematic circuit diagram showing one embodiment of the memory mat of FIG. 9 and its peripheral portion.

FIG. 10 is a schematic circuit showing one embodiment of the aforementioned memory mat and its peripheral portion. The construction of the memory array is similar to that of FIG. 8. In this embodiment, a pair of memory mats are provided for the sense amplifier SA, and the description will be made upon the relations between the sense amplifier SA and the data lines corresponding to the paired memory mats.

The sense amplifier SA has its paired input/output nodes connected with the corresponding input/output lines by a switch MOSFET YS1 selected by a first Y-decoder. These input/output lines are connected with an input/output line I/O shared between the odd and even sense amplifiers SA, by a switch MOSFET YS2 selected by the second Y-decoder. In other words, there are symmetrically arranged across the input/output line I/O the odd and even sense amplifiers and the switches which are provided for the sense amplifiers and adapted to be selected by the first Y-decoder.

The switch MOSFETs to be interposed between the data lines DL and the input/output nodes of the sense amplifiers SA are a reading precharge MOSFET, a programming precharge MOSFET and a switch MOSFET. These MOSFETs will be described in detailed with reference to FIGS. 15 and so on.

Figure 11:
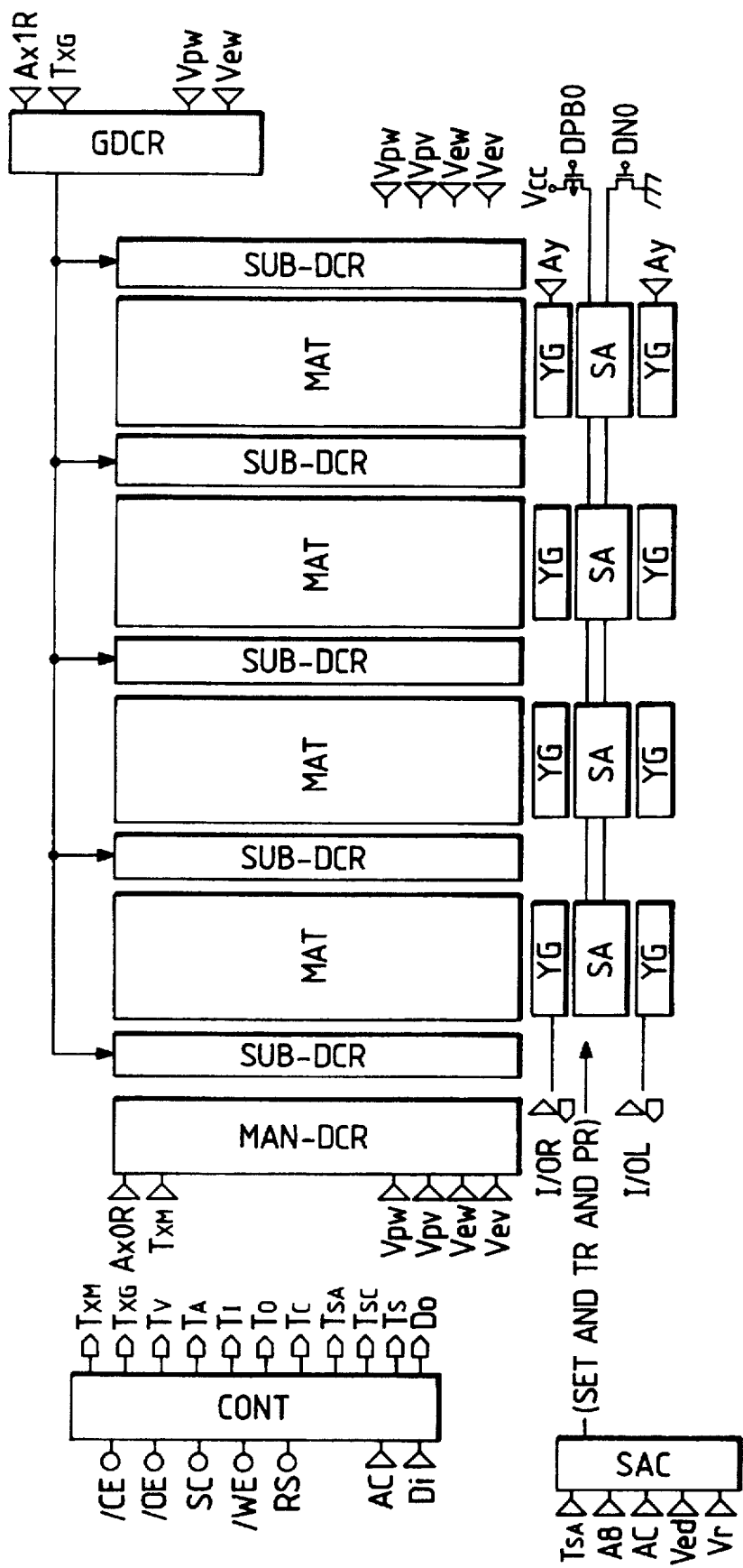
FIG. 11 is a block diagram showing a portion of still another embodiment of a flash erasable type EEPROM according to the present invention.
Figure 12:
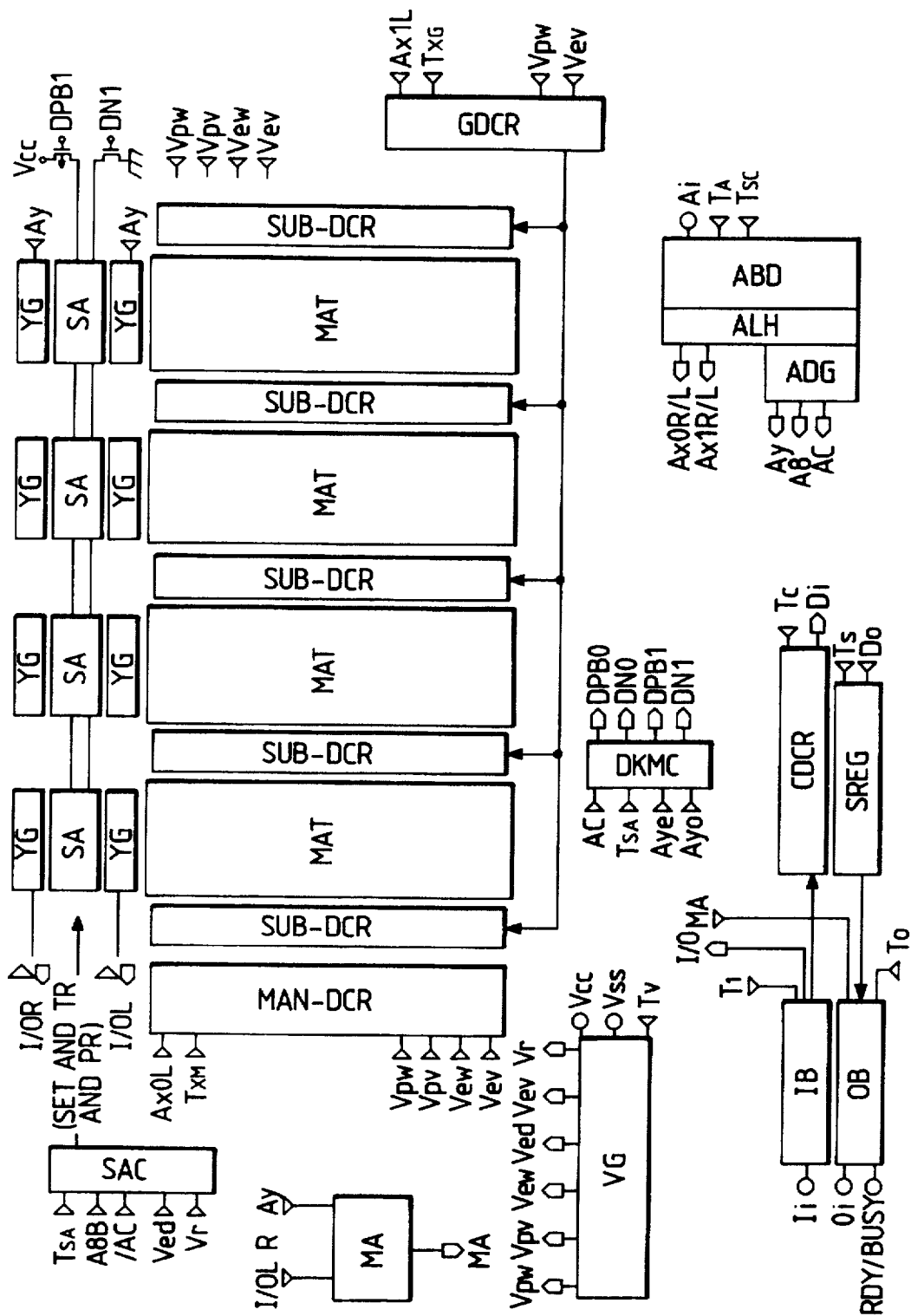
FIG. 12 is a block diagram showing the remaining portion of the embodiment of a flash erasable type EEPROM according to the present invention.

FIGS. 11 and 12 are the entire block diagrams showing another embodiment of the semiconductor memory device according to the present invention. Specifically, FIG. 11 presents a block diagram of a portion of the semiconductor memory device according to the present invention, and FIG. 12 presents the remaining block diagram. The memory array of FIGS. 11 and 12 is so symmetrically equipped with the sense amplifiers SA and the Y-gates that they are adjacent to each other. In short, the portion of the memory array of FIGS. 11 and 12 is similar to that of FIG. 9. In this embodiment, however, a pair of Y-gates YG are arranged across the sense.amplifier SA. A pair of input/output lines I/OR and I/OL are provided to correspond to the Y-gate.

The control circuit CONT and the sense amplifier control circuit SAC of FIG. 11 are similar to the aforementioned ones of FIG. 7. Moreover, the sense amplifier control circuit SAC, the voltage generator VG, the command decoder CDCR, the status register SREG, the data input buffer IB, the data output buffer OB, the address buffer ADB, the address generator ADG and the address latch AL of FIG. 12 are also similar to the aforementioned ones of FIG. 7. A main amplifier MA amplifies the signal on the input/output line I/OLR at the odd or even side and transmits it to the input of the data output buffer OB. In response to the address signals Aye and Ayo and timing signals AC and $T_{SA}$, a Deka MOS control circuit DKMC produces select signals DPB0 and DN0, DPB1 and DN1 corresponding to the odd or even sense amplifiers SA.

In this embodiment, the terminals to be used as the external ones of the semiconductor memory device are circled so that they may be discriminated from the internal ones. For example, the control signals /CE, /OE, SC, /WE and RS to be fed to the control circuit CONT belong to the external terminals. The address signals Ai to be fed to the address buffer ABD and the voltage terminals $V_{CC}$ and $V_{SS}$ disposed at the voltage generator VG belong to the external terminals. Moreover, a data terminal Ii corresponding to the data input buffer IB and the data terminals Oi and RDY/BUSY corresponding to the data output buffer OB belong to the external terminals.

FIG. 2 is a circuit diagram showing one embodiment of the sense amplifier and the memory array described above. The two sense amplifiers to be simultaneously operated and the circuit relating to two pairs of data lines connected with the two sense amplifiers are representatively shown in FIG. 2 by way of example. Their relations of connection will be described with reference to FIG. 13.

The sense amplifier SA is exemplified by the CMOS latch circuit in which the two CMOS inverter circuits, each composed of P-channel type MOSFETs and N-channel type MOSFETs, have their inputs and outputs cross-coupled. These CMOS latch circuits are activated when the P-channel type MOSFETs are fed at their source sides with the supply voltage through a P-channel type common power switch MOSFET Q4 and when the N-channel type MOSFET is fed at its source side with the earth potential of the circuit through an N-channel type common power switch MOSFET Q5.

These power switch MOSFETs Q4 and Q5 are used commonly for the aforementioned numerous sense amplifiers and are given a relatively large size to feed the sense amplifiers with their operating current. These switch MOSFETs Q4 and Q5 are called the "Deka MOS" because their size is enlarged, as described above.

Across the sense amplifiers, there are arranged a pair of bit lines BL0L and BL0R. These paired bit lines BL0L and BL0R are equipped with transfer MOSFETs Q2 and so on to be switched by the control signals TRL and TRR. In this embodiment, the righthand and lefthand bit lines are symmetrically arranged whereas the remaining bit lines BL1L and BL1R are also arranged with similar circuits. Hence, circuit symbols are attached to only the MOSFETs which are disposed in the lefthand bit line BL0L while including the individual MOSFETs, as will be described in the following.

The input nodes N0L and N0R of the sense amplifier SA are equipped with reset MOSFETs Q3 and so on to be switched by control signals SETL and SETR. These reset MOSFETs Q3 and so on reset the potentials of the input/output nodes N0L and N0R of the sense amplifier to the earth potential of the circuit before the input signals are fetched by the sense amplifiers.

The aforementioned bit lines BL0L and BL0R are equipped with precharge MOSFETs Q1 and so on. These precharge MOSFETs Q1 and so on are controlled by control signals PRL and PRR. In this embodiment, these control signals PRL and PRR are raised to the potentials which are higher by a threshold voltage Vth than the precharge voltage of the bit lines BL0L and BL0R. Specifically, when the lefthand bit line BL0L is selected in the reading operation, as will be described hereinafter, the control signal PRL is set to the voltage which is higher by the threshold voltage Vth than the bit line precharge voltage such as about 1 V. The bit line BL0R at the unselected side is used for producing the reference voltage at that time and is set to the voltage which is higher by the threshold voltage Vth than the precharge voltage such as 0.5 V corresponding to the reading reference voltage. As a result, the aforementioned precharge MOSFETs Q1 and so on operate as the source-follower amplify MOSFETs.

The input/output nodes N0L and N0R of the sense amplifier corresponding to the aforementioned bit lines BL0L and BL0R are connected through column switch MOSFETs with the input/output lines I/OLi and I/ORi. These column switch MOSFETs have their gates fed with a Y-select signal YGi. The input/output nodes N1L and N1R of the sense amplifier corresponding to the other bit lines BL1L and BL1R are connected through column switch MOSFETs with the input/output lines I/OLi and I/ORi. These column switch MOSFETs have their gates fed with a Y-select signal YGj. These input/output lines I/OLi and I/ORi are commonly used as a read signal passage and a program signal passage, as will be described hereinafter.

A select MOSFET QOD is connected between the common drain of memory MOSFETs QmO and so on constituting one block and the bit line BL0L. The source of the memory MOSFETs Qm0 and so on is equipped with a select MOSFET Q0S. The gates of these select MOSFETs Q0D and Q0S are fed with select signals STDL and STSL which are produced by the main decoder MAN-DCR. The gate of the select MOSFET disposed at the memory MOSFET connected with the bit line BL0R arranged at the righthand side of the sense amplifier SA is also fed with select signals STDR and STSR.

Figures 3A, 3B:
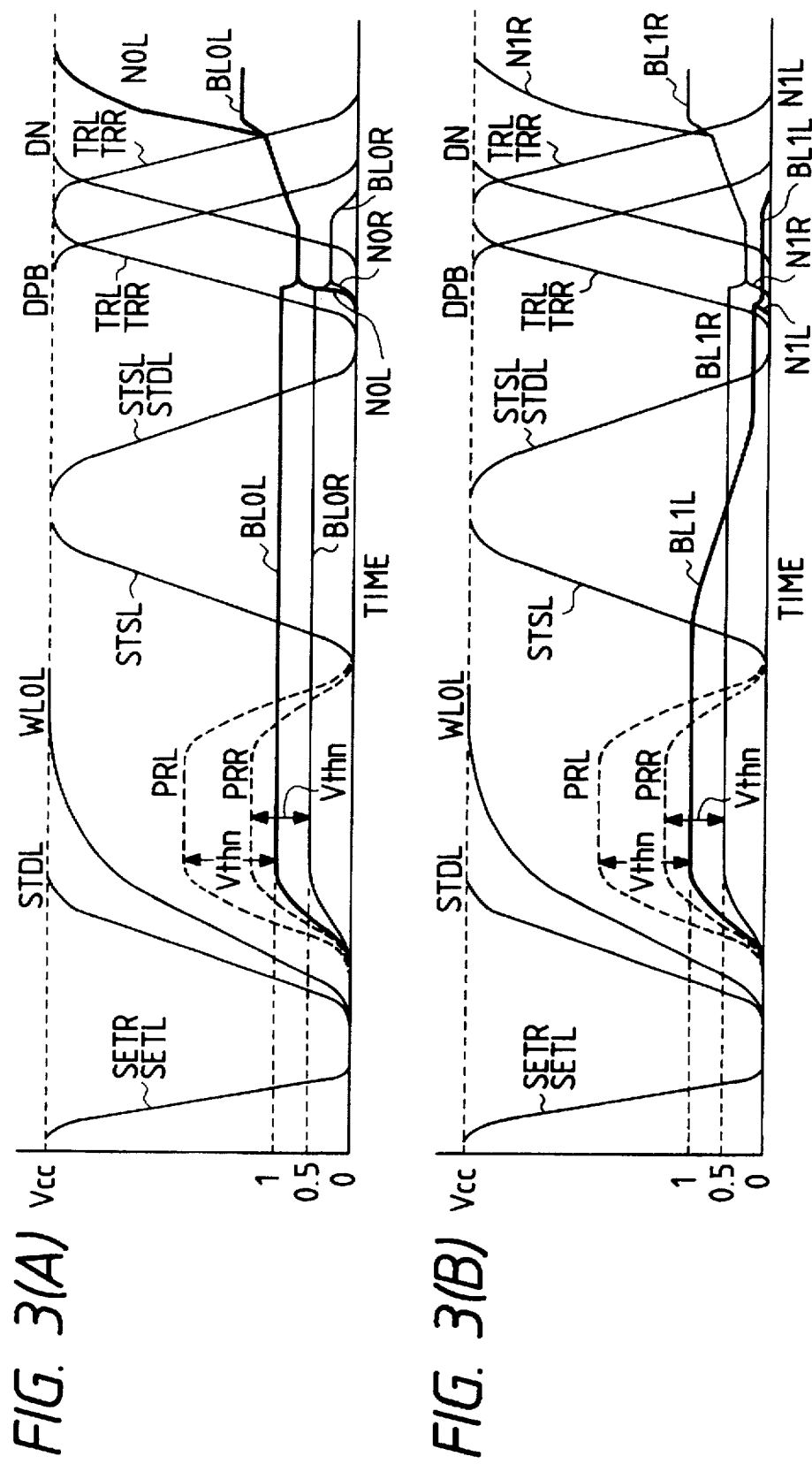
FIGS. 3(A) and 3(B) are waveform diagrams for explaining one embodiment of the reading operation of the sense amplifier.

FIGS. 3(A) and 3(B) present waveform charts for explaining one embodiment of the amplifying operations of the aforementioned sense amplifier. FIG. 3(A) shows the operations when the memory MOSFET on the bit line BL0L latches the data "0", that is, when the threshold voltage Vth of the memory MOSFET is higher than the select potential VCC of the word line (i.e., $Vth \geq V_{CC}$). FIG. 3(B) shows the operations when the memory MOSFET on the bit line BL1L latches the data "1", that is, when the threshold voltage Vth of the memory MOSFET is lower than the select potential $V_{CC}$ of the word line (i.e., $V_{CC} > Vth \geq 0$). Incidentally, both FIGS. 3(A) and 3(B) illustrate the case in which the data of the memory MOSFETs connected with the lefthand bit lines BL0L and BL1L, are to be read out by setting the control signal STDR to a low level.

The signals SETL and SETR are set to the low level so that the reset MOSFETs having fixed the input nodes N0L and N0R of the sense amplifier at the earth potential of the circuit are turned OFF. The signal STDL is set to the high level so that one memory block is selected. Substantially simultaneously with this, the word line WL0L is also set to the high level ($V_{CC}$).

When the selecting operation of the aforementioned X-line is started, the signals PRL and PRR are set to the voltage corresponding to the precharge voltage of the bit lines BL0L (or BL1L) and the BL0R (or BL1R), and the precharge MOSFETs Q1 and so on act as the source-follower amplify MOSFETs to precharge the selected memory array side bit line BL0L (or BL1L) connected with their source to about 1 V and the unselected memory array side bit line BL0R (or BL1R) to about 0.5 V. When this precharging operation is ended, the signals PRL and PRR are set to the low level so that the aforementioned precharge MOSFETs Q1 and so on are turned OFF. As a result, the bit lines BL0L (or BL1L) and BL0R (or BL1R) latch the aforementioned precharge level in the high impedance status.

The signal STSL is set to the high level. When the memory MOSFET selected with the selected word line is OFF, as shown in FIG. 3(A), the bit line BL0L has its potential retained as it is at the precharge level. When, on the other hand, the memory MOSFET connected with the selected word line is ON, as shown in FIG. 3(B), the bit line BL1L is discharged.

As the time period for lowering the potential of the bit line BL1L to the reference or lower voltage has elapsed, as shown in FIG. 3(B), both the signals STDL and STSL are lowered to the low level so as to minimize the stress in the selected MOSFET and in the unselected MOSFETs in the selected block. As a result, the precharge voltage of the bit lines BL0L and BL1L at the highest is applied to the memory MOSFETs.

Subsequently, the signals TRL and TRR are raised to the high level. As a result, the transfer MOSFETs Q2 and so on are turned ON to connect the bit lines BL0L (or BL1L) and BL0R (or BL1R) with the sense amplifier SA. Since the input nodes N0L (N1L) and N0R (N1R) of the sense amplifier SA are set to the earth potential, as described above, their charges are shared so that they are set to potentials according to those of the corresponding bit lines BL0L (or BL1L) and BL0R (or BL1R).

When the fetch of the input signals of the sense amplifier SA is ended, the signal DPB is set to the low level whereas the signal DN is set to the high level, so that the MOSFETs Q4 and Q5 are turned ON to start the amplifying operations of the sense amplifier SA. By this amplifying operation of the sense amplifier SA, as shown in FIG. 3(A), the bit line BL0L and the node N0L are raised to the high level whereas the bit line BI0R and the node N0R are lowered to the low level. In FIG. 3(B), on the other hand, by the amplifying operation of the sense amplifier SA, the bit line BL1L and the node N1L are lowered to the low level whereas the bit line BL1R and the node N1R are raised to the high level.

In this embodiment, in order to increase the speed of the operation and lower the power consumption, the signals TRL and TRR are set to the low level immediately after the start of the aforementioned amplification, that is, at the instant when the bit line BL0L (or BL1R) and the node N0L (or N1R) are slightly raised to the high level by the amplifying operation. In response to the low level of the signals TRL and TRR, the transfer MOSFETs Q2 and so on are turned OFF to isolate the sense amplifier SA from the bit lines BL0L (or BL1L) and BL0R (or BL1R). As a result, the sense amplifier SA is isolated from the bit line BL0L or BL1R which is given a larger parasitic capacitance by having a number of memory transistors or the like connected therewith. Thus, the input node N0L or N1R can be quickly raised to the high level such as the supply voltage $V_{CC}$ because it is sufficient to charge up only the low parasitic capacitor in its own input (or output) node.

Since, generally speaking, the parasitic capacitance of a bit line is made larger by ten or more times than that of the input node of a sense amplifier, it is possible to reduce the electric current necessary for charging up the bit line to the supply voltage $V_{CC}$ and to reduce the time constant of the bit line drastically. As a result, it is possible to increase the speed of the operation of the sense amplifier SA and to lower the power consumption of the same.

Figures 4A, 4B:
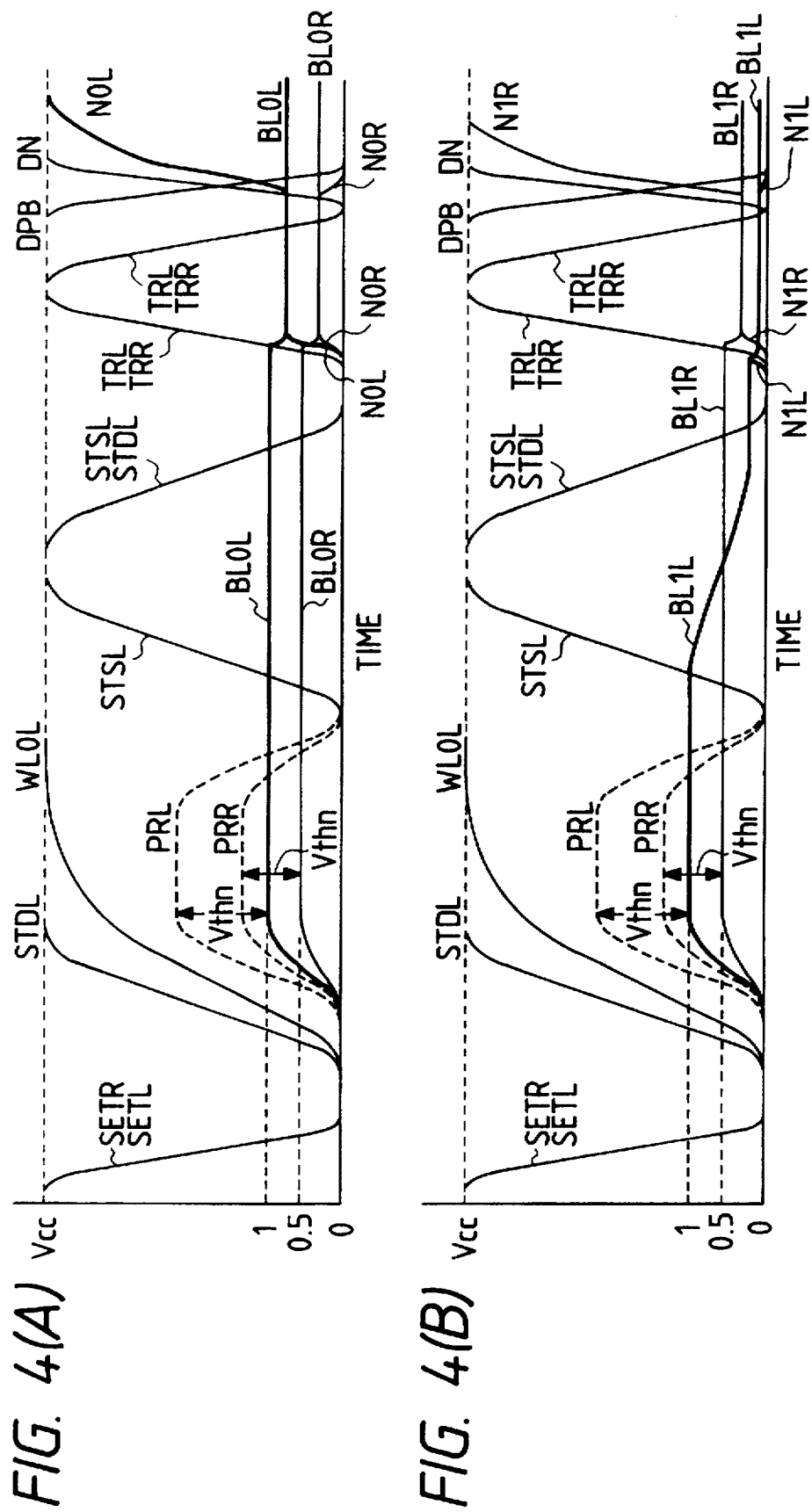
FIGS. 4(A) and 4(B) are waveform diagrams for explaining another embodiment of the reading operation of the sense amplifier.

FIGS. 4(A) and 4(B) are waveform charts for explaining another embodiment of the amplifying operations of the aforementioned sense amplifiers. FIG. 4(A) shows the operations when the memory MOSFET on the bit line BL0L latches the data "0", that is, when the threshold voltage Vth of the memory MOSFET is higher than the select potential $V_{CC}$ of the word line (i.e., $Vth \geq V_{CC}$). FIG. 4(B) shows the operations when the memory MOSFET on the bit line BL1L latches the data "1", that is, when the threshold voltage Vth of the memory MOSFET is lower than the select potential $V_{CC}$ of the word line (i.e., $V_{CC} \geq Vth \geq 0$). Incidentally, both FIGS. 4(A) and 4(B) illustrate the case in which the data of the memory MOSFETs connected with the lefthand bit lines BL0L and BL1L are to be read out by setting the control signal STDR to a low level.

In this embodiment, the timing for setting the signals TRL and TRR to the low level is placed before that for activating the sense amplifiers with the signals DPB and DN. Specifically, even if the transfer MOSFETs are turned OFF before the start of the amplifying operations of the sense amplifiers, as described, above, there arises no problem because the signal levels and the reference voltage have already been fetched according to the stored information of the memory MOSFETs in the input nodes N0L (or N1L) and N0R (or N1R) of the sense amplifiers. Since, in this case, no current is fed at the start of the amplification from the sense amplifiers SA to the bit lines, the effects of increasing the speed of the operation and lowering the power consumption can be better improved.

At the start for the sense amplifiers to start their amplifications, what is present in the input nodes is a signal having a relatively low level. In order to effect stable amplifying operations, therefore, there may be accomplished the two-stage amplifying operations, in which the operation voltage is fed at the start of the operation by the MOSFET for feeding a low current but is fed after the amplification signal grows to some level by the MOSFET for feeding a high current. In order to achieve these two-stage operations, the power switch MOSFETs may be constructed such that the MOSFETs having a smaller size and the MOSFETs having a larger size are connected in parallel and are so controlled that the smaller MOSFETs may be turned ON at the start of amplification whereas the larger MOSFETs may be turned ON later.

Figures 5A, 5B:
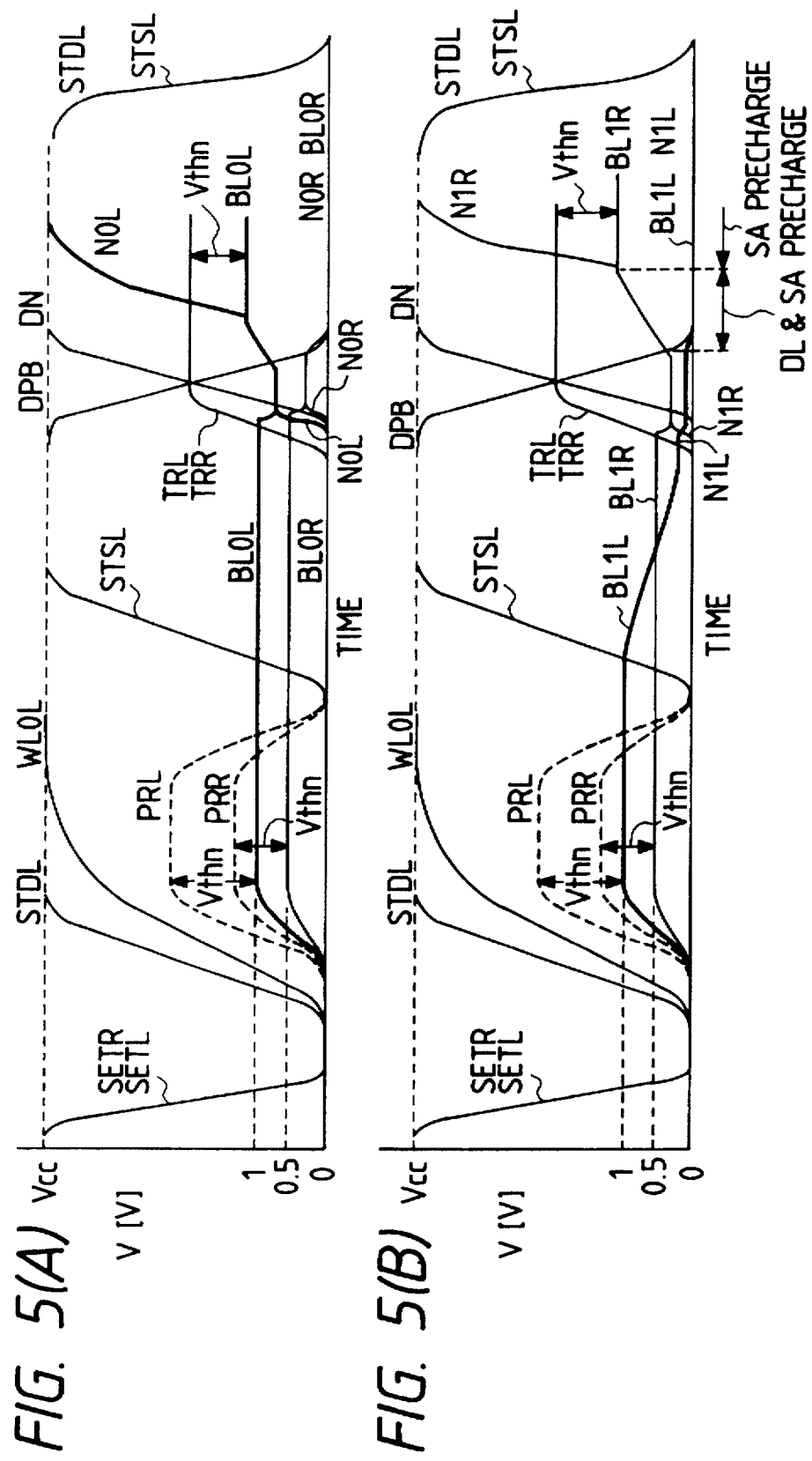
FIGS. 5(A) and 5(B) are waveform diagrams for explaining still another embodiment of the reading operation of the sense amplifier.

FIGS. 5(A) and 5(B) present waveform charts for explaining one embodiment of the amplifying operations of the aforementioned sense amplifier. FIG. 5(A) shows, as in FIG. 3(A), the operations when the memory MOSFET on the bit line BL0L latches the data "0", that is, when the threshold voltage Vth of the memory MOSFET is higher than the select potential $V_{CC}$ of the word line (i.e., $Vth \geq V_{CC}$). FIG. 5(B) shows the operations when the memory MOSFET on the bit line BL1L latches the data "1", that is, when the threshold voltage Vth of the memory MOSFET is lower than the select potential $V_{CC}$ of the word line (i.e., $V_{CC} \geq Vth \geq 0$). Incidentally, both FIGS. 5(A) and 5(B) illustrate the case in which the data of the memory MOSFETs connected with the lefthand bit lines BL0L and BL1L are to be read out by setting the control signal STDR to a low level.

The signals SETL and SETR are set to the low level so that the reset MOSFETs having fixed the input nodes N0L and N0R of the sense amplifier at the earth potential of the circuit are turned OFF. The signal STDL is set to the high level so that one memory block is selected. Substantially simultaneously with this, the word line WL0L is also set to the high level ($V_{CC}$).

When the selecting operation of the aforementioned X-line is started, the signals PRL and PRR are set to the voltage corresponding to the precharge voltage of the bit lines BL0L (or BL1L) and the BL0R (or BL1R), and the precharge MOSFETs Q1 and so on act as the source-follower amplify MOSFETs to precharge the selected memory array side bit line BL0L (or BL1L) connected with their source to about 1 V and the unselected memory array side bit line BL0R (or BL1R) to about 0.5 V. When this precharging operation is ended, the signals PRL and PRR are set to the low level so that the aforementioned precharge MOSFETs Q1 and so on are turned OFF. As a result, the bit lines BL0L (or BL1L) and BL0R (or BL1R) latch the aforementioned precharge level in the high impedance status.

The signal STSL is set to the high level. When the memory MOSFET selected with the selected word line is OFF, as shown in FIG. 5(A), the bit line BL0L has its potential retained as it is at the precharge level. When, on the other hand, the memory MOSFET connected with the selected word line is ON, as shown in FIG. 5(B), the bit line BL1L is discharged.

Subsequently, the signals TRL and TRR are set to the following intermediate high level. Specifically, this high level is not one corresponding to the aforementioned supply voltage $V_{CC}$, as shown in FIGS. 3(A) and 3(B), but an intermediate level necessary for reading out the high level of the bit line BL0L, that is, the voltage which is made higher by the threshold voltage Vth of the switch MOSFETs Q2 and so on than the high level of the bit line BL0L. As a result, the transfer MOSFETs Q2 and so on are turned ON to connect the bit lines BL0L (or BL1L) and BL0R (or BL1R) with the sense amplifier SA. Since the input nodes N0L (N1L) and N0R (N1R) of the sense amplifier SA are set to the earth potential, as described above, their charges are shared so that they are set to potentials according to those of the corresponding bit lines BL0L (or BL1L) and BL0R (or BL1R).

When the fetch of the input signals of the sense amplifier SA is ended, the signal DPB is set to the low level whereas the signal DN is set to the high level, so that the MOSFETs Q4 and Q5 are turned ON to start the amplifying operations of the sense amplifier SA. By this amplifying operation of the sense amplifier SA, as shown in FIG. 5(A), the bit line BL0L and the node N0L is raised to the high level whereas the bit line BL0R and the node N0R is lowered to the low level. In FIG. 5(B), on the other hand, by the amplifying operation of the sense amplifier SA, the bit line BL1L and the node N1L are lowered to the low level whereas the bit line BL1R and the node N1R are raised to the high level.

In this embodiment, the signals to be fed to the gates of the switch MOSFETs Q2 and so on are given the intermediate high level, as described above. When the node N0L is raised to the high level by the amplifying operation of the sense amplifier SA, the corresponding switch MOSFET is automatically turned OFF to accelerate the rise and lower the node N0L to the high level and lower the charge-up current at that time. The switch MOSFET corresponding to the node N0R at the low level side continues its ON status so that the potential of the bit line BL0R is lowered to a level as low as that of the earth potential of the circuit in accordance with the amplifying operation of the sense amplifier.

In this embodiment, the transfer MOSFET corresponding to the high level of the amplified output of the sense amplifier SA is automatically turned OFF to stop the potential of the high level reading bit line to a high level such as about 1 V so that the soft write in the memory cells can be prevented. Thus, the timing can be easily set because the signals STSL and the STDL need be lowered to the low level not before the start of the operation of the sense amplifier SA but at a proper timing after the start of the amplifying operation of the sense amplifier SA.

Figures 6A, 6B:
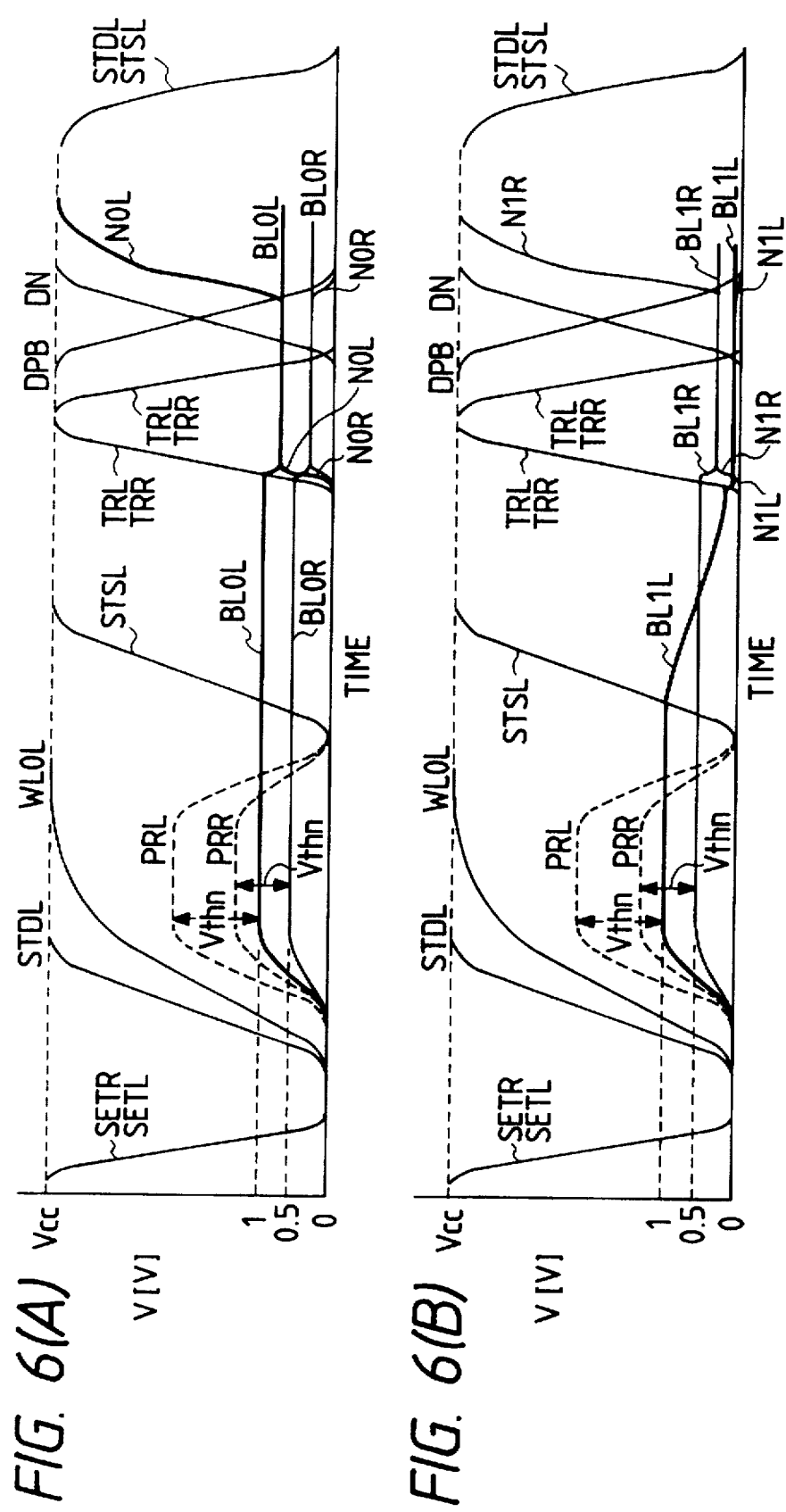
FIGS. 6(A) and 6(B) are waveform diagrams for explaining a further embodiment of the reading operation of the sense amplifier.

FIGS. 6(A) and 6(B) are waveform charts for explaining another embodiment of the amplifying operations of the aforementioned sense amplifiers. FIG. 6(A) shows, as in FIG. 4(A), the operations when the memory MOSFET on the bit line BL0L latches the data "0", that is, when the threshold voltage Vth of the memory MOSFET is higher than the select potential $V_{CC}$ of the word line (i.e., $Vth \geq V_{CC}$). FIG. 6(B) shows the operations when the memory MOSFET on the bit line BL1L latches the data "1", that is, when the threshold voltage Vth of the memory MOSFET is lower than the select potential $V_{CC}$ of the word line (i.e., $V_{CC} \geq Vth \geq 0$). Incidentally, both FIGS. 6(A) and 6(B) illustrate the case in which the data of the memory MOSFETs connected with the lefthand bit lines BL0L and BL1L are to be read out by setting the control signal STDR to a low level.

In this embodiment, as in FIGS. 4(A) and 4(B), the timing for setting the signals TRL and TRR to the low level is placed before that for activating the sense amplifiers with the signals DPB and DN. Specifically, even if the transfer MOSFETs are turned OFF before the start of the amplifying operations of the sense amplifiers, as described, above, there arises no problem because the signals levels and the reference voltage have already been fetched according to the stored information of the memory MOSFETs in the input nodes N0L (or N1L) and N0R (or N1R) of the sense amplifiers. Since, in this case, no current is fed at the start of the amplification from the sense amplifiers SA to the bit lines, the effects of increasing the speed of the operation and lowering the power consumption can be better improved.

In this embodiment, the timing for changing the signals STDL and STSL from the high level to the low level is caused to occur after the sense amplifiers SA have started their amplifying operations, by noting that the signals TRL and TRR to be fed to the gates of the switch MOSFETs Q2 and so on are lowered to the low level before the sense amplifiers SA start their amplifying operations. Specifically, the soft write in the memory cells can be prevented by the aforementioned OFF states of the switch MOSFETs Q2 and so on. Thus, the timing can be easily set because the signals STSL and the STDL need be lowered to the low level not before the start of the operation of the sense amplifier SA but at a proper timing after the start of the amplifying operation of the sense amplifier SA.

Incidentally, at the start for the sense amplifiers to start their amplifications, what is present in the input nodes is a signal having a relatively low level, as described above. In order to effect stable amplifying operations, therefore, there may be accomplished the two-stage amplifying operations, in which the operation voltage is fed at the start of the operation by the MOSFET for feeding a low current but is fed after the amplification signal grows to some level by the MOSFET for feeding a high current. For these operations, the power switch MOSFETs may be constructed such that the MOSFETs having a smaller size and the MOSFETs having a larger size are connected in parallel and are so controlled that the smaller MOSFETs may be turned ON at the start of amplification whereas the larger MOSFETs may be turned ON later.

Figure 20:
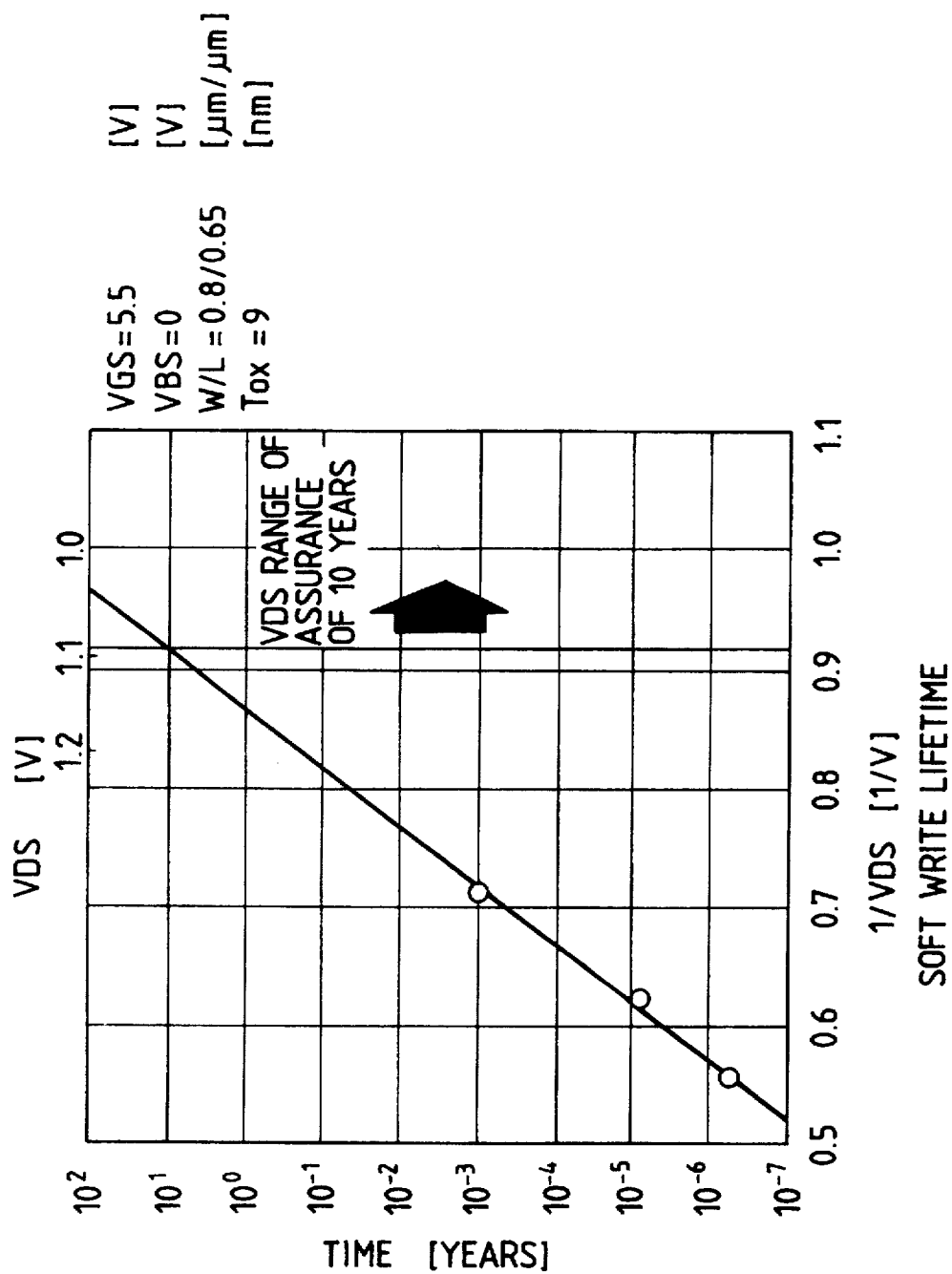
FIG. 20 is a characteristic diagram plotting a soft write lifetime in the flash erasable type EEPROM.

FIG. 20 is a characteristic graph plotting the soft write lifetime. This soft write is the phenomenon in which the data of the logic "0" is written in the memory cell of the logic "1" when in the reading operation. Specifically, a current is fed to a memory cell and is sensed in the reading operation. If the drain voltage is high at this time, the probability of producing the hot electrons increases so that the electrons are partially fetched by the floating gate. If the floating gate thus fetches the electrons, it is charged with the negative potential so that the threshold voltage of the memory cell rises. If this threshold voltage exceeds a certain potential, the memory cell cannot be read as the logic "1" so that the stored data has its lifetime exhausted.

In order to elongate the soft write lifetime, the probability of producing the hot electrons may be lowered. The method for this could be exemplified by a method of lowering the drain voltage of the memory cells or a method of widening the depletion layer so as to weaken the electric field in the vicinity of drains. For advancing the microstructure of elements, however, the depletion layer widening method is disadvantageous. In this embodiment, therefore, the drain voltage at the reading time is lowered, as described above. In order to guarantee a soft write lifetime of ten years, as plotted in the characteristic graph of FIG. 20, devices are made by setting the precharge voltage of the bit lines BL connected with the drains of the memory cells to about 1 V so that the amplified outputs of the sense amplifiers may not be applied to the drains of the memory cells.

Figure 13:
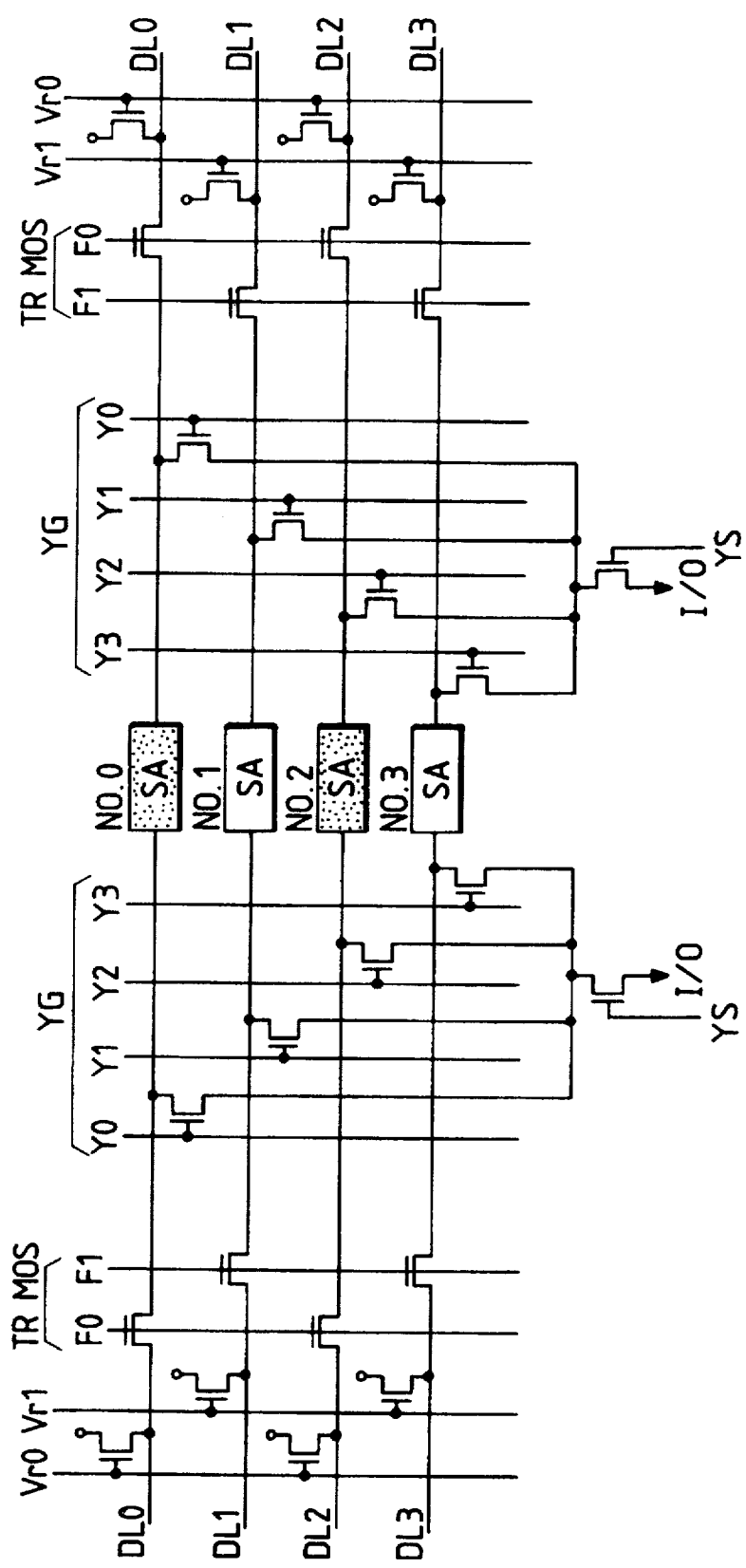
FIG. 13 is a circuit diagram showing one embodiment for explaining the relations between the data lines and the sense amplifiers of the flash erasable type EEPROM according to the present invention.

FIG. 13 is a circuit diagram showing one embodiment for explaining the relations between the data lines and the sense amplifiers made of the aforementioned CMOS latch circuits. In FIG. 13, there are representatively shown the four data lines DL0 to DL3 of the two memory mats arranged across the sense amplifiers and the four sense amplifiers SA corresponding to the data lines.

Figure 15:
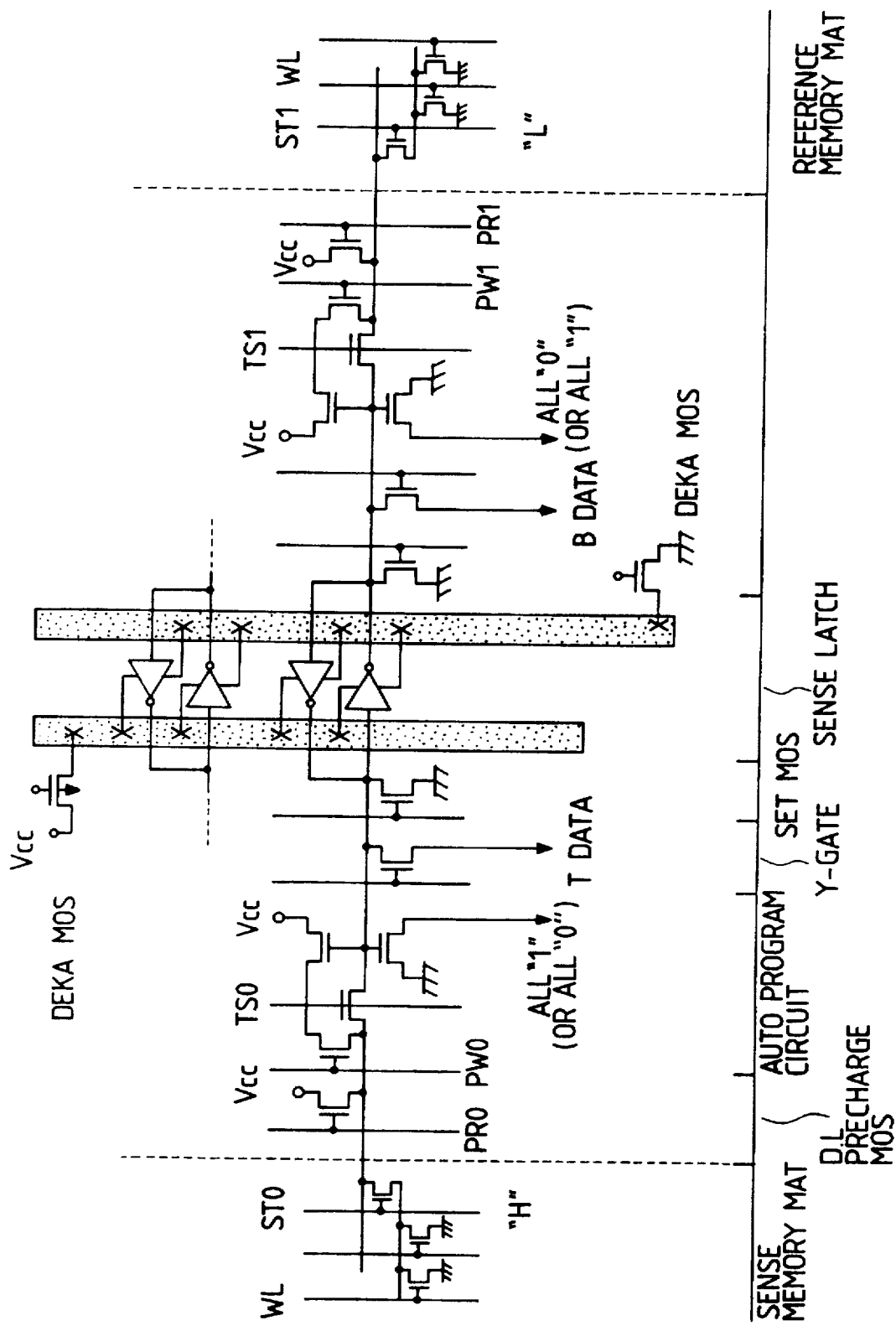
FIG. 15 is a circuit diagram showing another embodiment for explaining the relations between the data lines and the sense amplifiers of the flash erasable type EEPROM according to the present invention.

The sense amplifier SA is constructed, as shown in FIG. 15, of a pair of CMOS inverter circuits which have their inputs and outputs cross-coupled. The latch circuit constructed of the CMOS inverter circuits is activated by the power feeding switch MOSFETS, as described above, so that it performs an operation substantially similar to that of a clocked inverter circuit. In FIG. 15, therefore, the two aforementioned two CMOS inverter circuits are shown in the form of the clocked inverter circuits.

The paired inputs of the sense amplifier are equipped with the MOSFETs (i.e., Q3 of FIG. 2) for setting the input nodes to 0 V. As a result, the input signals are set to 0 V before the amplifying operations are started. The paired inputs of the sense amplifiers SA are connected with the data lines DL0 to DL3 through the transfer MOSFETs (i.e., TRMOS). These transfer MOSFETs are divided to correspond to the even data lines DL0 and DL2 and the odd data lines DL1 and DL3 so that they are fed with the select signals F0 and F1, respectively. Correspondingly, the precharge MOSFETs disposed on the even data lines DL0 and DL2 have their gates fed with the precharge voltage Vr0, and the precharge MOSFETs disposed on the odd data lines DL1 End DL3 have their gates fed with the precharge voltage Vr1. Those select signals F0 and F1 correspond to the signals TRL and TRR of FIG. 2. The voltages Vr0 and Vr1 also correspond to the signals PRL and PRR.

The paired inputs of the sense amplifiers SA are individually equipped with the switch MOSFETs which constitute the Y-gate and fed at their respective gates with the select signals Y0 to Y3. The Y-gate YG has its outputs made common and connected through the switch MOSFETs constituting the second stage Y-gate with the input/output data line I/O leading to the data input buffer or the data output buffer.

In this embodiment, one of the paired memory mats is activated when the other is inactivated. Although this inactivated memory mat is left inactive, the aforementioned transfer MOSFETs are turned ON to connect the corresponding data lines with the inputs of the sense amplifiers. At the inactive memory mat side, moreover, the precharge voltage Vr of the data lines is set to a low level such as an intermediate potential between the high level and the low level of the data lines of the activated memory mat. As a result, the data lines of the memory mat at the inactive side can be used as the reference voltage (Ref. DL) of the sense amplifiers.

The write data is so latched in each latch when in the programming operation as to correspond to the construction that the sense amplifier SA is constructed of the CMOS latch circuit, although not especially limitative thereto. Specifically, after the write data has been set by opening the Y-gates sequentially, the even and odd transfer MOSFETs are simultaneously turned ON and subjected to the programming operation. In response to this programming operation, the operating voltage of the sense amplifiers is switched to a voltage such as 4 V. In the reading operation and the program verifying operation, on the contrary, the even and odd data lines are alternately activated in a staggered manner while excepting the first memory cycle.

Figure 14:
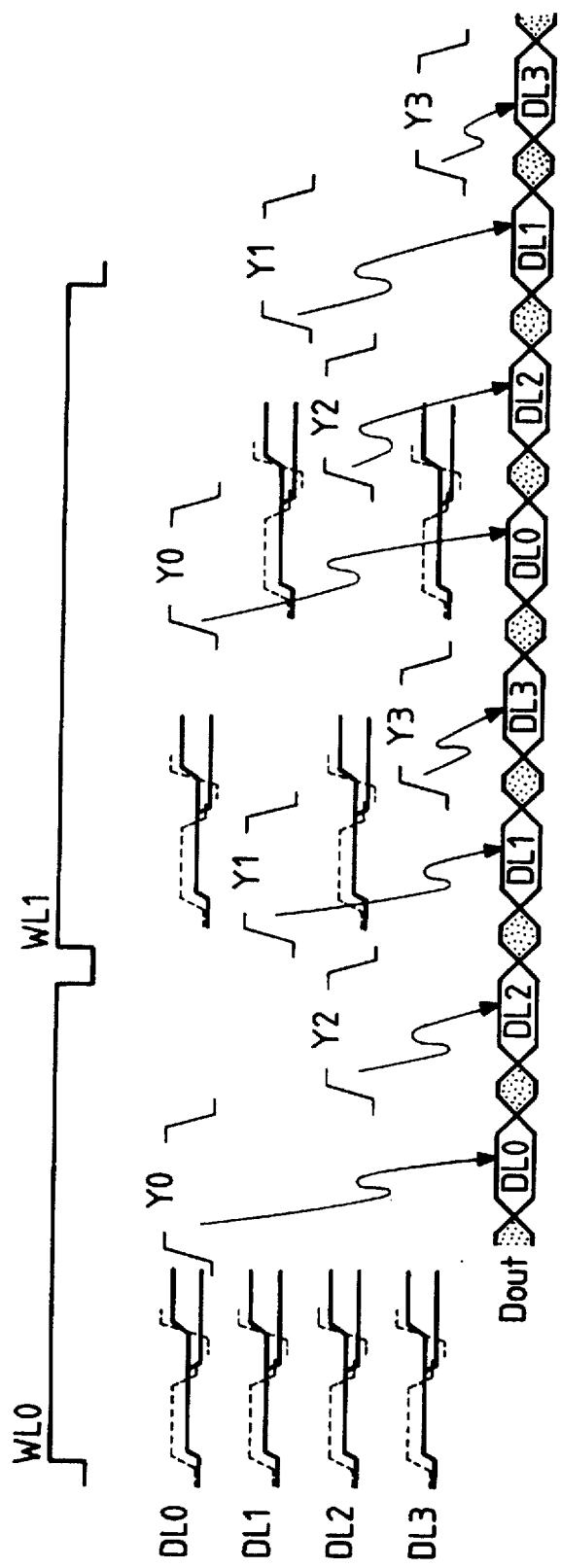
FIG. 14 is a waveform chart for explaining one example of the reading operation corresponding to the embodiment of FIG. 13.

FIG. 14 is a waveform chart for explaining one example of the reading operation corresponding to the embodiment of FIG. 13. FIG. 14 shows an example of the continuous reading operation accompanied by the switching of the word lines.

When the word line WL0 is selected by the first memory cycle, all the data lines DL0 to DL3 and so on are activated so that all the sense amplifiers are accordingly activated. Voltages indicated by broken lines in FIG. 14 are the precharge voltage Vr and the select signals of the transfer MOSFETS. The select signal Y0 is produced so that the data Dout corresponding to the data line DL0 is outputted, and the select signal Y2 is sequentially produced so that the data Dout corresponding to the data line DL2 is outputted.

Subsequently, the data Dout corresponding to the odd data line DL1 is outputted in response to the select signal Y1. In parallel with this outputting, the word lines are switched. Specifically, the word line WL0 is unselected, and the word line WL1 corresponding to a next address is then selected. In response to the selection of the word line WL1, the even data lines DL0 and DL2 having been read are precharged, and the sense amplifiers accomplish their amplifying operations. The reason why the word lines can be switched is caused by the fact that the sense amplifiers SA and the data lines are isolated by the transfer MOSFETS. Specifically, the outputting of the data Dout corresponding to the odd data line DL1 may be effected merely by outputting the data latched by the sense amplifiers SA.

Subsequent to the outputting of the data Dout corresponding to the data line DL1, the data Dout corresponding to the data line DL3 is outputted by the select signal Y3. After this, the select signal Y0 is produced again so that the data Dout of the data line DL0 corresponding to the word line WL1 is outputted. In this meanwhile, the signal read out to the data lines DL1 and DL3 by the selecting operation of the word line WL2 is amplified by the sense amplifiers. From now on, the data Dout corresponding to the data lines DL2, DL1 and DL3 are sequentially outputted in response to the select signals Y2; Y1 and Y3. The switching of the word lines is carried out, if carried out again, at the timing when the outputting of the data Dout corresponding to the even data line DL2 is ended.

FIG. 15 is a circuit diagram showing another embodiment of the relations between the data lines and the aforementioned sense amplifiers. In this embodiment, an automatic programming function is added to the embodiment of FIG. 13.

Figure 16A:
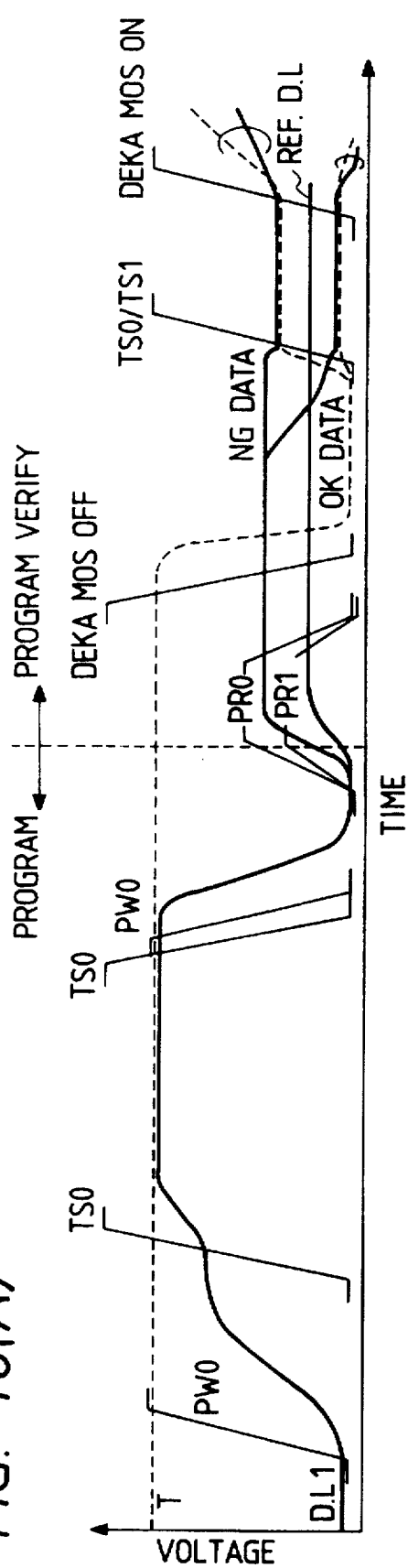
FIGS. 16(A) and 16(B) are waveform diagrams for explaining one example of the operation of the circuit of the embodiment of FIG. 15.
Figure 16B:
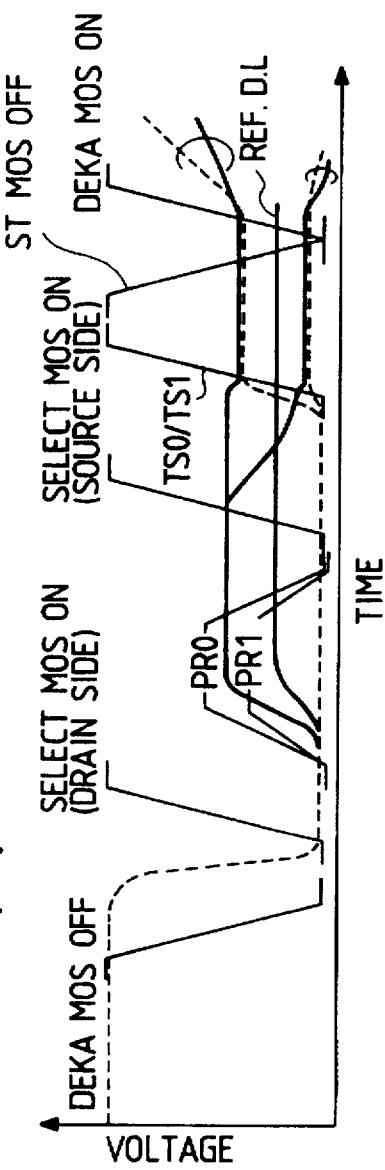

FIGS. 16(A) and 16(B) are waveform charts for explaining one example of the operations of the aforementioned embodied circuit of FIG. 15. FIG. 16(A) is a waveform chart showing the programming operation and the program verifying operation. The aforementioned automatic programming function will be described with reference to the waveform chart. In this programming operation, the program data T Data is inputted through the Y-gate prior to the programming operation of the memory cells, although not shown in FIG. 16(A). At this time, the sense amplifiers are activated because the Deka MCSes are ON, so that they fetch the aforementioned program data.

In response to a signal PW0, the MOSFETs are turned ON. In response to the program data T Data, if at the low level, the MOSFETs of the automatic program circuit are turned OFF so that the potential of the data line DL1 is left at the low level. If the data T Data is at the high level, as shown in FIG. 16(A), the MOSFETs of the automatic programming circuit are turned ON to effect the charge-up with the supply voltage $V_{CC}$ through the MOSFETs which are turned ON by the signal PW0. As a result, the data line DL1 having a high parasitic capacitance is preliminarily charged up. As a result, the program data latched in the sense amplifiers can be prevented from being inverted by the low level of the data line DL1.

Next, a signal TS0 is raised to the level $V_{CC}$ or a higher level. As a result, the transfer MOSFETs are turned ON so that the potential of the data line DL1 is raised through the sense amplifiers to a level such as about 4 V necessary for the writing operation. Since the word lines are set to a voltage such as −10 V, although not shown, a high voltage toward the drain side is applied between the floating gates and the drains so that the programming operation is carried out by the tunnel current flowing from the floating gates to the drains.

At the end of the aforementioned programming operation, the signal PW0 is set to the low level so that the set MOSFET is turned ON to set the potential of the data line DL1 to the low level. Thus, the operation transfers to the program verification. Specifically, the signal PR0 is set to the precharge voltage Vr so that the data line DL1 is precharged. On the contrary, the signal PR1 at the side of the unselected memory mat is set to the potential corresponding to the reference voltage so that the potential of the data line DL1 at the side of the unselected memory mat is set to the reference voltage Ref. DL.

The aforementioned Deka MOSFETs are turned OFF so that the sense amplifiers are once brought into the inactivated state. The potential of the data line DL1 is lowered to the low level (i.e., "OK Data"), if the programmed memory MOSFET has its threshold voltage lowered, but is left at the high level (i.e., "NG Data") if the programming is insufficient to leave the threshold voltage at the high level. In response to the signals TS0 and TS1, the transfer MOSFETs are turned ON so that the aforementioned read data and the reference voltage Ref. DL are fed to the inputs of the sense amplifiers to turn ON and activate the Deka MOSFETs.

If the result of this verification is insufficient, as described above, the programming operations are executed again and are repeated by a limited number of times till the aforementioned signal of the low level is achieved. If the programming is decided to be insufficient even the predetermined number is reached, the memory cell is decided to be NG and is switched to a redundancy circuit, if necessary.

FIG. 16(B) is a waveform chart for explaining the reading operations. At the end of the preceding reading operation, the Deka MOSFET is turned OFF. The data line DL has its potential set to the low level by the set MOSFET. Moreover, the select MOSFETs at the drain side of the memory cells divided into the aforementioned blocks are turned ON. Moreover, the precharge voltages PR0 and PR1 set the paired data lines to the precharge voltage and the reference voltage in response to the select/unselect of the individual memory mats. After this, the select MOSFETs at the individual sides of the memory cells divided into the blocks are turned ON so that the potential of the data lines at the selected memory mat are left at the precharge level, if the selected memory MOSFETs are OFF, and are extracted to the low level by the memory current if ON.

Signals TS0 and TS1 are set to the high level so that the transfer MOSFETs are turned ON to connect the aforementioned paired data lines with the inputs of the sense amplifiers. Then, the set MOSFETs are turned OFF whereas the Deka MOSFETs are turned ON to activate the sense amplifiers thereby to amplify the aforementioned read signals.

In the aforementioned embodiment of FIG. 15, the MOSFETs made receptive of the input voltages of the sense amplifiers are provided as detectors for detecting all "1". Specifically, when a wired OR logic is taken with the MOSFETs which are disposed at the inputs of other similar sense amplifiers so that all the data lines read out are at the low level, all of the MOSFETs can be turned OFF to achieve a detected signal at the high level. If any of the sense amplifiers takes the high level at its input, the MOSFETs are turned ON to produce the detected signal at the low level so that all the signals can be detected to be at "1" if all the MOSFETs are OFF. In short, the data lines at the lefthand side of the sense amplifier of FIG. 15 are in the erased state if the logic "1" is read out of the memory cells.

With the construction in which the outputs of the sense amplifiers are to be produced by a righthand circuit similar to the lefthand one, on the contrary, the programming and erasing logical levels are inverted in the data lines at the righthand side. Specifically, the memory cells to be disposed on the righthand data lines of a differential sense amplifier are erased by the output at the low level, and the erase state is decided if all the external terminals are at "0".

Figure 17:
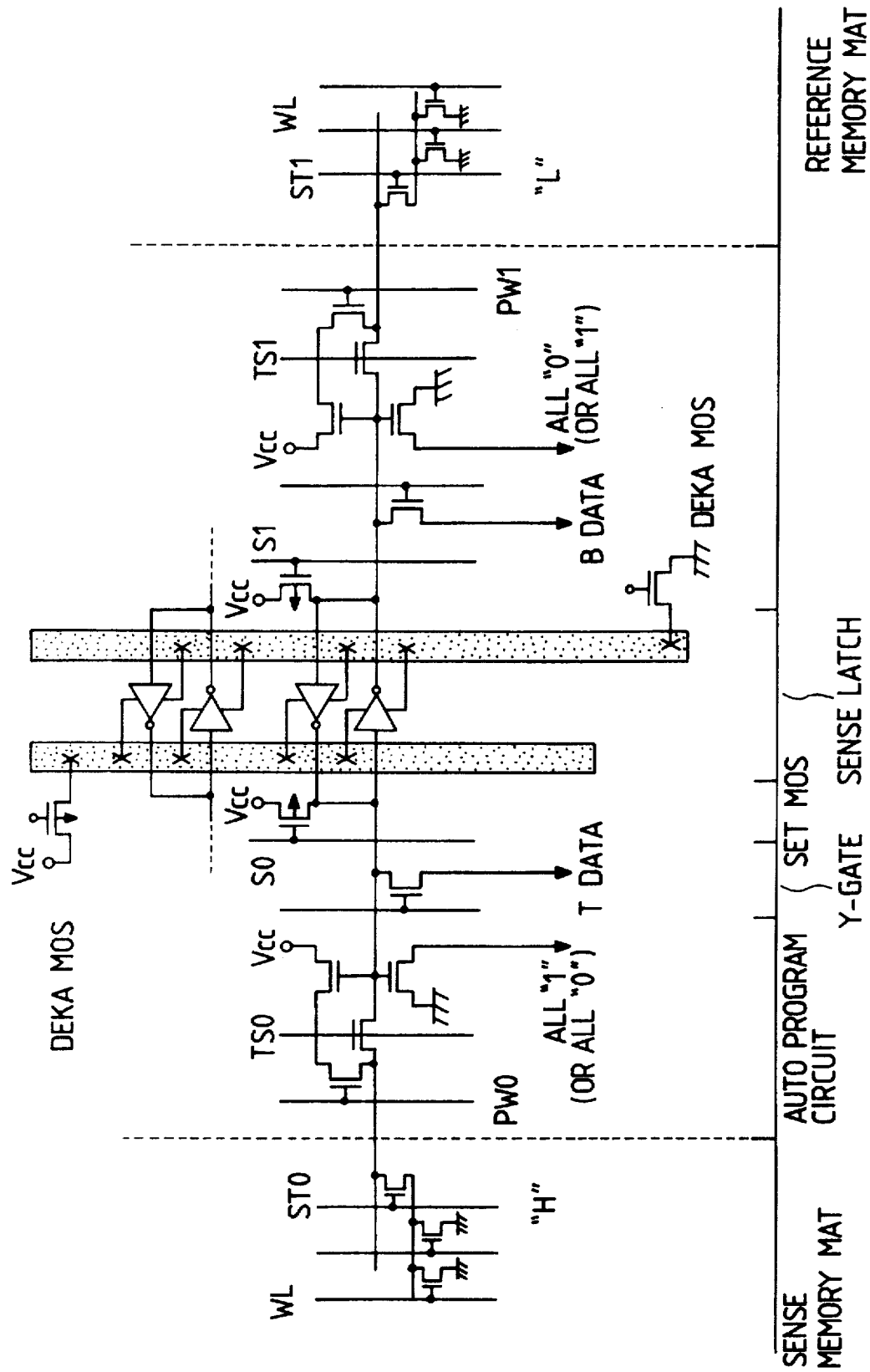
FIG. 17 is a circuit diagram showing still another embodiment for explaining the relations between the data lines and the sense amplifiers of the flash erasable type EEPROM according to the present invention.

FIG. 17 is a circuit diagram showing still another embodiment for explaining the relations between the data lines and the aforementioned differential sense amplifier. In this embodiment, the precharge MOSFETs are omitted. In other words, the programming signals PW0 and PW1 are given the reading precharge function to omit the precharge MOSFETS.

The signal PW is used in the programming operation and in the verifying and reading operations, too, so that the voltage level is changed according to the individual operation modes. In short, the signals PW and PR of FIG. 15 are realized by the single signal PW.

The aforementioned MOSFET is provided for each data line. A semiconductor memory device given a memory capacity as high as about 32 Mbits is equipped with a number of data lines such as 4,096 or 8,192 data lines so that the number of the precharge MOSFETs to be eliminated is accordingly increased.

Figure 18:
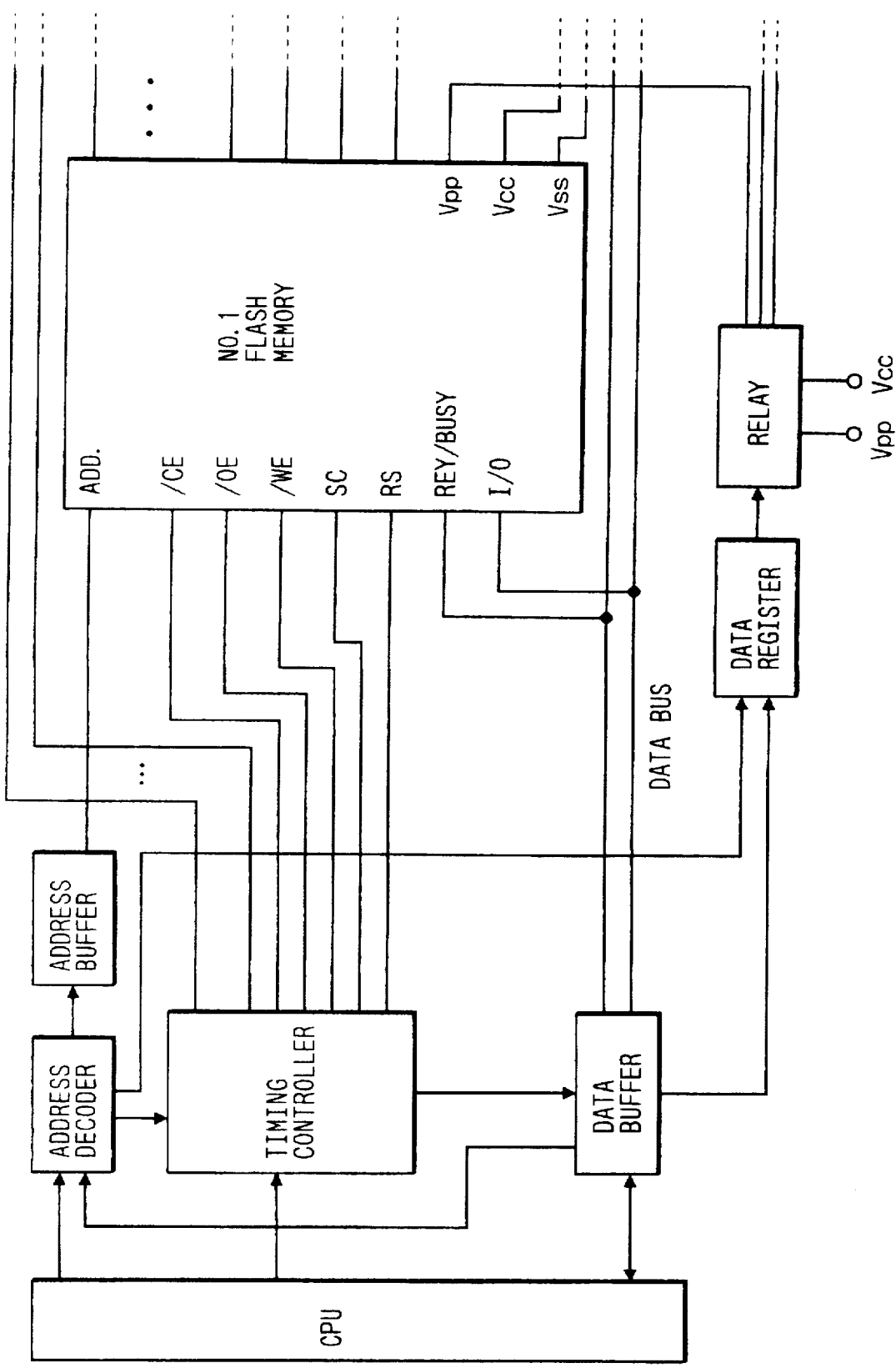
FIG. 18 is a block diagram showing one embodiment of a data processing system such as a microcomputer using the flash erasable type EEPROM according to the present invention.

FIG. 18 is a block diagram showing one embodiment of a data processing system such as a microcomputer using the semiconductor memory device according to the present intention. The flash memory of FIG. 18 is constructed of a semiconductor memory device such as the aforementioned one of the foregoing embodiment.

The system of this embodiment comprises a central processing unit (or a microprocessor) CPU, an address decoder, a timing controller, a data buffer, a data register, a relay and the aforementioned flash memory. Although this flash memory is exemplified by one representative, a plurality of flash memories are connected in parallel so as to establish a desired memory capacity. Incidentally, a memory RAM, a ROM and an input/output unit necessary for constituting the system such as the microcomputer are omitted because they have no direct relation to the present invention.

The SC pin of the aforementioned flash memory is a serial clock input terminal. In synchronism with the clock SC inputted from this input terminal, the data is serially outputted. The serial clock SC is produced by the timing controller, but the system clock of the CPU may be directly inputted.

The serial read from the flash memory is accomplished by incrementing the internal address in synchronism with the clock SC when the signals /CE and /OE are at the low level. In response to this, the data is serially outputted from the I/O pin. At this time, the address bus is set free. When a serial output is made from the first flash memory, the signal /OE may be isolated to prevent the data conflict on the data bus so as to achieve the output from the not-shown second flash memory.

Figure 19:
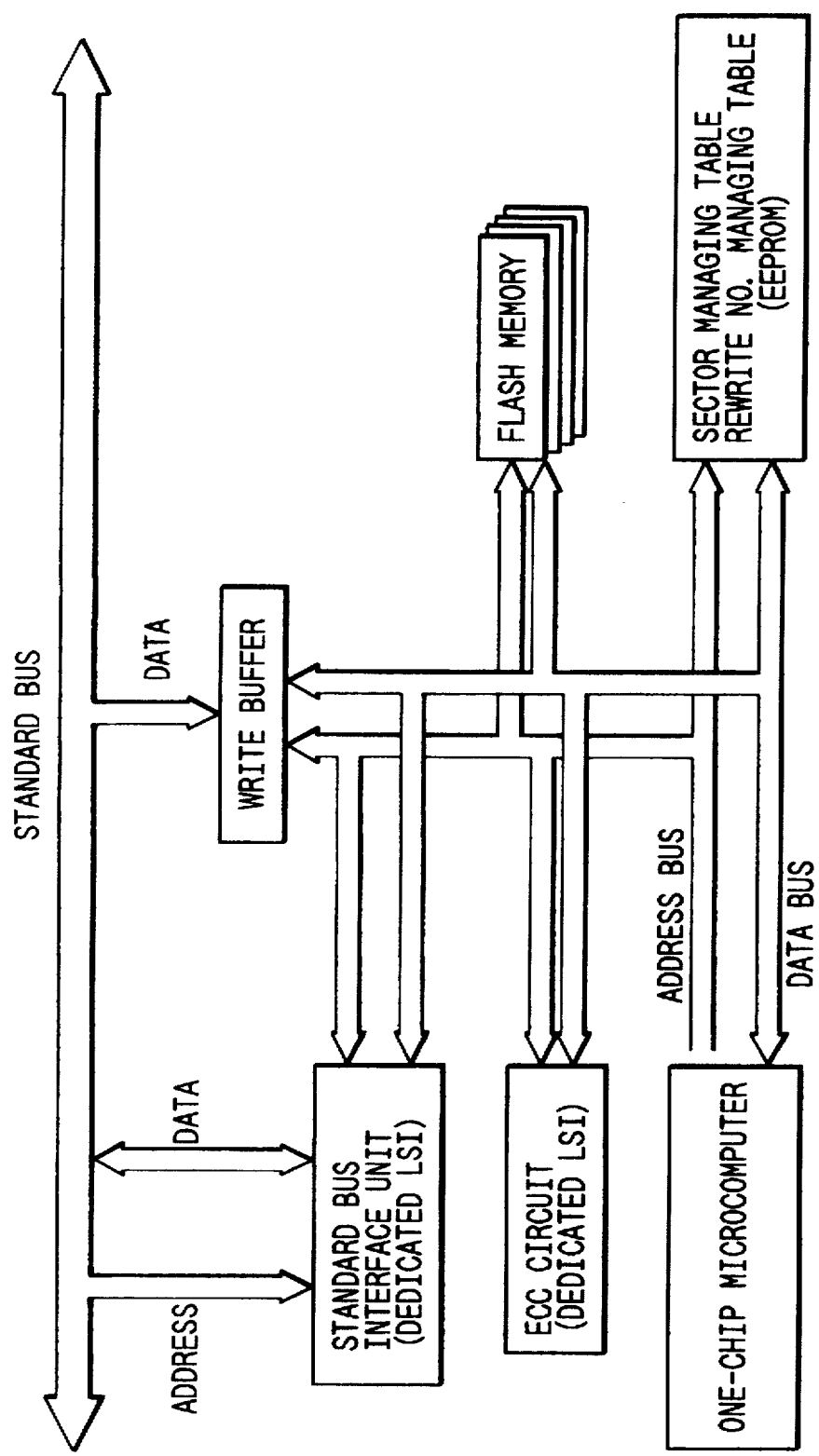
FIG. 19 is a block diagram showing one embodiment of the memory device using the flash erasable type EEPROM according to the present invention.

FIG. 19 is a block diagram showing one embodiment of the memory device using the semiconductor memory device according to the present invention. The memory device of this embodiment uses the flash memory of the foregoing embodiment in its data memory unit. In the operations of programming and reading the data in and from the flash memory, the error of the data is detected by an ECC circuit which is constructed of a dedicated LSI.

A sector managing table is constructed of the EEPROM or the like. This sector managing table performs the programming, reading and erasing operations at the unit of one word line and handles them as one sector, although not especially limitative thereto. The reprogramming of the data at the sector unit is carried out by counting the number of reprogramming operations (i.e., the number of programming or erasing operations) so that the reliability may be enhanced by inhibiting an access to the sector if the allowable value is exceeded.

The programming operation of the flash memory requires a longer time period than that for the reading operation. Therefore, the programming operation from a host system or the like is carried out not directly upon the flash memory, but the program data is inputted to the write buffer. This write buffer has a memory capacity of one sector and fetches the memory date of one sector, although not especially limitative thereto. The program data fetched by the write buffer is sequentially programmed at the unit of a byte in the sense amplifier of the flash memory. When the data of one sector is programmed in the sense amplifier, the aforementioned programming operation is started.

In the reading operation, when the leading address is fed to the flash memory, as described above, the data of one sector is serially outputted at the unit of one byte according to the order of addresses prepared by the internal address generator (or address counter).

The controls of the programming and reading operations of the sector managing table described above are carried out by a one-chip microcomputer (i.e., a microcomputer of one chip). The memory device of this embodiment is given a compatibility with the hard memory device or the floppy disc memory device of the prior art and is connected with a standard bus through a standard bus interface unit. This standard bus is connected with a central processing unit CPU, a main memory and a cache memory (e.g., a first cache memory and a second cache memory) constituting the host system, although not especially limitative thereto.

The operational effects to be obtained from the foregoing embodiments are as follows.

(1) The sense amplifiers are exemplified by the CMOS circuits, and the switch circuits are connected between the input/outputs of the sense amplifiers and the data lines or bit lines. These switch circuits are turned OFF immediately before or after the amplifying operations of the sense amplifiers so that the data lines or bit lines having a high capacitance, as a result of being coupled to numerous memory transistors, are isolated from the input nodes of the sense amplifiers in the substantial amplifying operations of the sense amplifiers. Thus, the sense amplifiers may drive only the parasitic capacitors of their inputs and outputs. As a result, it is possible to increase the speed of the operation and to lower the power consumption.

(2) The sense amplifiers are exemplified by the CMOS circuits, and the switch circuits are connected between the input/outputs of the sense amplifiers and the data lines or bit lines. The corresponding switch MOSFETs are automatically turned OFF in response to the output signals to be raised to the high level in the substantial amplifying operations of the sense amplifiers by feeding the gates of the switch MOSFETs with an intermediate level corresponding to the precharge voltage of the bit lines so that the data lines or bit lines having a high capacitance, as a result of being coupled to numerous memory transistors, are isolated from the input nodes of the sense amplifiers in the substantial amplifying operations of the sense amplifiers. Thus, the sense amplifiers may drive only the parasitic capacitors of their inputs and outputs. As a result, it is possible to increase the speed of the operation, to lower the power consumption and to facilitate the timing control.

(3) The sense amplifiers are divided into first and second groups corresponding to the odd and even data lines arranged adjacent to each other. While the output signals of the sense amplifiers belonging to one group are being serially outputted, the word lines are switched, and the sense amplifiers of the other group are caused to amplify the read signals from the memory cells corresponding to the switched word lines. By reading the odd and even data lines alternately, it is possible to reduce the coupling noise between the adjacent data lines and to effect a continuous serial reading operation at a high speed.

Although our invention has been specifically described in connection with its embodiments, it should not be limited to the foregoing embodiments but can naturally be modified in various manners without departing from the gist thereof. For example, the memory transistors may be either of the EPROM type for erasures with ultraviolet rays or of the type constituting the mask ROM for storing the data fixedly. The sense amplifiers may be provided to correspond to the paired bit lines in one memory mat. In this case, the reading operation may be carried out from either the odd bit lines or the even bit lines, and the reference voltage may be achieved from the other bit lines.

The present invention can be widely applied to the semiconductor memory device which is given a high threshold voltage or a low threshold voltage according to the stored information. This semiconductor memory device may be packaged in a digital integrated circuit such as a one-chip microcomputer.

The effect to be obtained from a representative of the invention disclosed herein will be briefly described in the following. Specifically, the sense amplifiers are exemplified by the CMOS circuits, and the switch circuits are connected between the input/ outputs of the sense amplifiers and the data lines or bit lines. These switch circuits are turned OFF immediately before or soon after the amplifying operations of the sense simplifiers so that the data lines or bit lines having a high as a result of being coupled to numerous memory transistors, are isolated from the amplifying operations of the main portion of the amplifying operations of the sense amplifiers. Thus, the sense amplifiers may drive only the parasitic capacitances of their inputs and outputs. As a result, it is possible to increase the speed of the operation and to lower the lower consumption.

What is claimed is:

1. A semiconductor memory device comprising:
    a plurality of first data lines;
    a plurality of second data line;
    a plurality of memory cells each of which has one of first and second threshold voltages in accordance with stored data therein and is coupled to a respective data line from either said plurality of first data lines or said plurality of second data lines;
    a plurality of first precharge circuits coupled to said plurality of first data lines, respectively;
    a plurality of second precharge circuits coupled to said plurality of second data lines, respectively;
    a plurality of sense amplifiers each of which is coupled to one first data line of said plurality of first data lines and one second data line of said plurality of second data lines, each of which has a pair of input terminals, one of which is to be fed with a reference first voltage, and each of which amplifies data of a selected memory cell in a read operation;
    a plurality of first switch circuits each of which couples a respective one of said plurality of first data lines to one of the pair of input terminals of a respective one of said plurality of sense amplifiers; and
    a plurality of second switch circuits each of which couples a respective one of said plurality of second data lines to the other of the pair of input terminals of said respective one of said plurality of sense amplifiers,
    wherein after a write operation is performed, in which data is written in a memory cell of said plurality of memory cells in accordance with data set in a corresponding sense amplifier of said plurality of sense amplifiers, a first and a second precharge circuit of said first and second precharge circuits precharge a corresponding first data line and a corresponding second data line coupled to said sense amplifier set with said data, in said read operation for verifying whether said data is written in said memory cell,
    wherein said first precharge circuit precharges said first data line coupled to said sense amplifier set with said data to a second voltage, higher than said reference first voltage, when said second precharge circuit precharges said second data line coupled to said sense amplifier set with said data to said reference first voltage, and said second precharge circuit precharges said second data line coupled to said sense amplifier set with said data to said second voltage when said first precharge circuit precharges said first data line coupled to said sense amplifier set with said data to said reference first voltage, and
    wherein after said first and second precharge circuits precharge said first and second data lines, coupled to said sense amplifier set with said data, in said read operation, respectively, each of said first and second switch circuits is turned ON, and each of said first and second switch circuits is turned OFF before data associated with said memory cell performed with said write operation is amplified to a voltage level by said sense amplifier which is higher than said second voltage.

2. The semiconductor memory device according to claim 1,
    wherein said sense amplifier includes a flip-flop circuit having a pair of input/output terminals coupled to said pair of input terminals of said sense amplifier, respectively; and including
    a control circuit coupled to said flip-flop circuit for controlling activation of said flip-flop circuit.

3. The semiconductor memory device according to claim 2,
    wherein each of said first and second switch circuits is turned ON before said flip-flop circuit is activated.

4. The semiconductor memory device according to claim 3,
    wherein each of said plurality of memory cells includes:
        a first region and a second region formed in a semiconductor body, said first region being coupled to one of said plurality of first data lines, or one of said plurality of second data lines,
        a first insulating film covering a region between said first and said second regions,
        a floating gate covering said first insulating film,
        a second insulating film covering said floating gate, and
        a control gate, covering said second insulating film, coupled to one of a plurality of word lines.

5. The semiconductor memory device according to claim 4,
    wherein said flip-flop circuit includes a cross-coupled arrangement of a pair of CMOS inverters, and
    wherein said control circuit includes a pull-up power switching MOSFET and a pull-down power switching MOSFET.

6. The semiconductor memory device according to claim 5, further including:
    first and second reset circuits being coupled in a manner for resetting the input/output terminals of said flip-flop circuit to a reference ground voltage, respectively, prior to a precharging operation by said first and second precharge circuits.

7. The semiconductor memory device according to claim 3,
    wherein said flip-flop circuit includes a cross-coupled arrangement of a pair of CMOS inverters, and
    wherein said control circuit includes a pull-up power switching MOSFET and a pull-down power switching MOSFET.

8. The semiconductor memory device according to claim 3, further including:
    first and second reset circuits being coupled in a manner for resetting the input/output terminals of said flip-flop circuit to a reference ground voltage, respectively, prior to a precharging operation by said first and second precharge circuits.

9. The semiconductor memory device according to claim 3, wherein each of the first and second precharge circuits includes a first MOS transistor switch which turns ON in response to a gate voltage having an amplitude greater than the voltage to which a data line associated therewith is precharged by at least the threshold voltage of said first MOS transistor switch.

10. The semiconductor memory device according to claim 9,
    wherein each of the first and second switch circuits includes a second MOS transistor switch which turns ON in response to a control voltage having an amplitude corresponding to that of a power source voltage for operating said sense amplifier or an amplitude greater than that of said second voltage by at least the threshold voltage of said second MOS transistor switch.

11. A semiconductor memory device comprising:
    a plurality of first data lines;
    a plurality of second data lines;
    a plurality of memory cells each of which has one of first and second threshold voltages in accordance with stored data therein and is coupled to a respective data line from either said plurality of first data lines or said plurality of second data lines;
    a plurality of first precharge circuits coupled to said plurality of first data lines, respectively;
    a plurality of second precharge circuits coupled to said plurality of second data lines, respectively;
    a plurality of sense amplifiers each of which is coupled to one first data line of said plurality of first data lines and one second data line of said plurality of second data lines, each of which has a pair of input terminals, one of which is to be fed with a reference first voltage, and each of which amplifies data of said selected memory cell in a read operation;
    a plurality of first switch circuits each of which couples a respective one of said plurality of first data lines to one of the pair of input terminals of a respective one of said plurality of sense amplifiers; and
    a plurality of second switch circuits each of which couples a respective one of said plurality of second data lines to the other of the pair of input terminals of said respective one of said plurality of sense amplifiers,
    wherein after a write operation is performed, in which data is written in a memory cell of said plurality of memory cells in accordance with data set in a corresponding sense amplifier of said plurality of sense amplifiers, a first and a second precharge circuit of said first and second precharge circuits precharge a corresponding first data line and a corresponding second data line coupled to said sense amplifier set with said data, in said read operation for verifying whether said data is written in said memory cell,
    wherein said first precharge circuit precharges said first data line coupled to said sense amplifier set with said data to a second voltage, higher than said reference first voltage, when said second precharge circuit precharges said second data line coupled to said sense amplifier set with said data to said reference first voltage, and said second precharge circuit precharges said second data line coupled to said sense amplifier set with said data to said second voltage when said first precharge circuit precharges said first data line coupled to said sense amplifier set with said data to said reference first voltage, and
    wherein after said first and second precharge circuits precharge said first and second data lines coupled to said sense amplifier set with said data in said read operation, respectively, each of said first and second switch circuits is turned ON, and each of said first and second switch circuits is turned OFF during amplification of data associated with said memory cell performed in said write operation by said sense amplifier.

12. The semiconductor memory device according to claim 11,
    wherein said sense amplifier includes a flip-flop circuit having a pair of input/output terminals coupled to said pair of input terminals of said sense amplifier, respectively; and including
    a control circuit coupled to said flip-flop circuit for controlling activation of said flip-flop circuit.

13. The semiconductor memory device according to claim 12,
    wherein each of the first and second switch circuits is turned ON before said flip-flop circuit is activated.

14. The semiconductor memory device according to claim 13, wherein each of said plurality of memory cells includes:
a first region and a second region formed in a semiconductor body, said first region being coupled to one of said plurality of first data lines or one of said plurality of second data lines,
a first insulating film covering a region between said first and said second regions,
a floating gate covering said first insulating film,
a second insulating film covering said floating gate, and
a control gate, covering said second insulating film, coupled to one of a plurality of word lines.

15. The semiconductor memory device according to claim 14, wherein said flip-flop circuit includes a cross-coupled arrangement of a pair of CMOS inverters, and
wherein said control circuit includes a pull-up power switching MOSFET and a pull-down power switching MOSFET.

16. The semiconductor memory device according to claim 15, further including:

first and second reset circuits being coupled in a manner for resetting the input/output terminals of said flip-flop circuit to a reference ground voltage, respectively, prior to a precharging operation by said first and second precharge circuits.

17. The semiconductor memory device according to claim 13, wherein said flip-flop circuit includes a cross-coupled arrangement of a pair of CMOS inverters, and
wherein said control circuit includes a pull-up power switching MOSFET and a pull-down power switching MOSFET.

18. The semiconductor memory device according to claim 13, further including:

first and second reset circuits being coupled in a manner for resetting the input/output terminals of said flip-flop circuit to a reference ground voltage, respectively, prior to a precharging operation by said first and second precharge circuits.

19. The semiconductor memory device according to claim 13, wherein each of the first and second precharge circuits includes a first MOS transistor switch which turns ON in response to a gate voltage having an amplitude greater than the voltage to which a data line associated therewith is precharged by at least the threshold voltage of said first MOS transistor switch.

20. The semiconductor memory device according to claim 19, wherein each of the first and second switch circuits includes a second MOS transistor switch which turns ON in response to a control voltage having an amplitude corresponding to that of a power source voltage for operating said sense amplifier or an amplitude greater than that of said second voltage by at least the threshold voltage of said second MOS transistor switch.

21. A semiconductor memory device comprising:

a plurality of first data lines,;
a plurality of second data lines;
a plurality of memory cells each of which has one of first and second threshold voltages in accordance with stored data therein and is coupled to a respective data line from either said plurality of first data lines or said plurality of second data lines;
a plurality of sense amplifiers each of which has a pair of input terminals, one of which is to be fed with a reference first voltage, and each of which amplifies data of a selected memory cell in a read operation;
a plurality of first switch circuits each of which couples a respective one of said plurality of first data lines to one of the pair of input terminals of a respective one of said plurality of sense amplifiers; and
a plurality of second switch circuits each of which couples a respective one of said plurality of second data lines to the other of the pair of input terminals of said respective one of said plurality of sense amplifiers, wherein after a write operation is performed in which data is written in a memory cell of said plurality of memory cells in accordance with data set in a corresponding sense amplifier of said plurality of sense amplifiers, a first and a second precharge circuit of a plurality of first and second precharge circuits precharge a corresponding first data line and a corresponding second data line coupled to said sense amplifier set with said data, in said read operation for verifying whether said data is written in said memory cell, wherein said first precharge circuit precharges said first data line coupled to said sense amplifier set with said data to a second voltage, higher than said reference first voltage, when said second precharge circuit precharges said second data line coupled to said sense amplifier set with said data to said reference first voltage, and said second precharge circuit precharges said second data line coupled to said sense amplifier set with said data to said second voltage when said first precharge circuit precharges said first data line coupled to said sense amplifier set with said data to said reference first voltage, and wherein each of said first and second switch circuits is turned ON in said read operation, and each of said first and second switch circuits is turned OFF during amplification of data associated with said memory cell performed with said write operation by said sense amplifier.

22. The semiconductor memory device according to claim 21, wherein said sense amplifier includes a flip-flop circuit having a pair of input/output terminals coupled to said pair of input terminals of said sense amplifier, respectively; and including
a control circuit coupled to said flip-flop circuit for controlling activation of said flip-flop circuit.

23. The semiconductor memory device according to claim 22, wherein each of the said first and second switch circuits is turned ON before said flip-flop circuit is activated.

24. The semiconductor memory device according to claim 23, wherein each of said plurality of memory cells includes:
a first region and a second region formed in a semiconductor body, said first region being coupled to one of said plurality of first data lines or one of said plurality of second data lines,
a first insulating film covering a region between said first and said second regions,
a floating gate covering said first insulating film,
a second insulating film covering said floating gate, and a control gate, covering said second insulating film, coupled to one of a plurality of word lines.

25. The semiconductor memory device according to claim 24, wherein said flip-flop circuit includes a cross-coupled arrangement of a pair of CMOS inverters, and wherein said control circuit includes a pull-up power switching MOSFET and a pull-down power switching MOSFET.

26. The semiconductor memory device according to claim 25, further including:

first and second reset circuits being coupled in a manner for resetting the input/output terminals of said flip-flop circuit to a reference ground voltage, respectively, prior to start of said read operation.

27. The semiconductor memory device according to claim 23, wherein said flip-flop circuit includes a cross-coupled arrangement of a pair of CMOS inverters, and wherein said control circuit includes a pull-up power switching MOSFET and a pull-down power switching MOSFET.

28. The semiconductor memory device according to claim 23, further including:

first and second reset circuits being coupled in a manner for resetting the input/output terminals of said flip-flop circuit to a reference ground voltage, respectively, prior to start of said read operation.

29. A nonvolatile memory circuit comprising:

a plurality of first data lines;

a plurality of second data lines;

a plurality of nonvolatile memory cells, each of which has one of a first and a second threshold voltage in accordance with data stored therein and is coupled to one of said plurality of first and second data lines;

a precharge circuit including a plurality of first precharge circuits coupled to said plurality of first data lines, respectively, and selectively precharging said plurality of first data lines to one of a reference first voltage and a second voltage higher than said reference first voltage in a read operation, and a plurality of second precharge circuits coupled to said plurality of second data lines, respectively, and selectively precharging said plurality of second data lines to the other of said reference first voltage and said second voltage in the read operation, said precharge circuit precharging to said second voltage that one of said first and second data lines to which a selected nonvolatile memory cell in the read operation is coupled;

a plurality of sense amplifiers each of which has a pair of inputs and which amplifies data in the nonvolatile memory cells in the read operation; and a switch circuit including a plurality of first switch circuits each of which is coupled between a respective one of said plurality of first data lines and one of the inputs of a respective one of said plurality of sense amplifiers and a plurality of second switch circuits each of which is coupled between a respective one of said second data lines and the other of the inputs of said respective one of said plurality of sense amplifiers, said plurality of first and second switch circuits being in a closed state after a write operation is performed, in which data is written in a memory cell of said plurality of nonvolatile memory cells in accordance with data set in a sense amplifier of said plurality of sense amplifiers, for verifying whether said data is written in said memory cell, and a first and a second data line coupled to said sense amplifier set with said data are precharged, and said plurality of both the first and second switch circuits being in an opened state, respectively, before said sense amplifier amplifies data associated with said selected nonvolatile memory cell to a voltage level higher than said second voltage.

30. The nonvolatile memory circuit according to claim 29, wherein said sense amplifier includes a flip-flop circuit having a pair of input/output terminals coupled to said pair of input terminals of said sense amplifier, respectively; and including a control circuit coupled to said flip-flop circuit for controlling activation of said flip-flop circuit.

31. The nonvolatile memory circuit according to claim 30, wherein each of the first and second switch circuits is turned ON before said flip-flop circuit is activated.

32. The nonvolatile memory circuit according to claim 31, wherein said flip-flop circuit includes a cross-coupled arrangement of a pair of CMOS inverters, and wherein said control circuit includes a pull-up power switching MOSFET and a pull-down power switching MOSFET.

33. The nonvolatile memory circuit according to claim 32, further including:

first and second reset circuits being coupled in a manner for resetting the input/output terminals of said flip-flop circuit to a reference ground voltage, respectively, prior to a precharging operation by said first and second precharge circuits.

34. The nonvolatile memory circuit according to claim 33, wherein each of the first and second precharge circuits includes a first MOS transistor switch which turns ON in response to a gate voltage having an amplitude greater than the voltage to which a data line associated therewith is precharged by at least the threshold voltage of said first MOS transistor switch.

35. The nonvolatile memory circuit according to claim 34, wherein each of the first and second switch circuits includes a second MOS transistor switch which turns ON in response to a control voltage having an amplitude corresponding to that of a power source voltage for operating said sense amplifier or an amplitude greater than that of said second voltage by at least the threshold voltage of said second MOS transistor switch.

36. The nonvolatile memory circuit according to claim 35, wherein each of said plurality of nonvolatile memory cells includes:

a first region and a second region formed in a semiconductor body, said first region being coupled to one of said plurality of first data lines or one of said plurality of second data lines, a first insulating film covering a region between said first and said second regions, a floating gate covering said first insulating film, a second insulating film covering said floating gate, and a control gate, covering said second insulating film, coupled to one of a plurality of word lines.

37. The nonvolatile memory circuit according to claim 29, wherein each of said plurality of nonvolatile memory cells includes:

a first region and a second region formed in a semiconductor body, said first region being coupled to one of said plurality of first data lines or one of said plurality of second data lines, a first insulating film covering a region between said first and said second regions, a floating gate covering said first insulating film, a second insulating film covering said floating gate, and a control gate, covering said second insulating film, coupled to one of a plurality of word lines.

* * * * *